(12) United States Patent
Miyoshi et al.

(10) Patent No.: US 8,709,552 B2
(45) Date of Patent: Apr. 29, 2014

(54) RESIN COMPOSITION AND DISPLAY DEVICE USING THE SAME

(75) Inventors: Kazuto Miyoshi, Otsu (JP); Mika Koshino, Otsu (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 140 days.

(21) Appl. No.: 13/146,794

(22) PCT Filed: Jan. 15, 2010

(86) PCT No.: PCT/JP2010/050402
§ 371 (c)(1),
(2), (4) Date: Aug. 9, 2011

(87) PCT Pub. No.: WO2010/087238
PCT Pub. Date: Aug. 5, 2010

(65) Prior Publication Data
US 2011/0284855 A1   Nov. 24, 2011

(30) Foreign Application Priority Data

Jan. 29, 2009   (JP) ................................. 2009-017790

(51) Int. Cl.
*C08F 2/50* (2006.01)
*G03F 7/23* (2006.01)
*G03F 7/30* (2006.01)

(52) U.S. Cl.
USPC .......... 428/1.1; 428/1.25; 428/1.26; 428/1.33; 428/1.62; 428/917; 430/18; 430/100; 430/143; 430/190; 430/191; 430/192; 430/193; 430/270.1; 430/280.1; 430/281.1; 522/100; 522/143; 522/144; 522/162; 522/164; 522/173; 522/176

(58) Field of Classification Search
USPC ................... 428/1, 1.25, 1.26, 1.33, 62, 917; 430/18, 100, 191, 192, 193, 270.1, 430/280.1, 281.1, 326, 330; 522/100, 143, 522/144, 162, 164, 173, 176
See application file for complete search history.

(56) References Cited

U.S. PATENT DOCUMENTS

2004/0197703 A1  10/2004  Miyoshi et al.
2008/0108723 A1*  5/2008  Taniguchi et al. ............ 522/152

FOREIGN PATENT DOCUMENTS

| CN | 101142529 A | 3/2008 |
|----|-------------|--------|
| JP | 8-134349 A | 5/1996 |
| JP | 8-143670 A | 6/1996 |
| JP | 10-62989 A | 3/1998 |
| JP | 10-170715 A | 6/1998 |
| JP | 2003-121997 A | 4/2003 |
| JP | 2006-313237 A | 11/2006 |
| JP | 2007-63502 A | 3/2007 |
| JP | 2008-7744 A | 1/2008 |
| JP | 2008-122501 A | 5/2008 |
| JP | 2009-227697 A | 10/2009 |
| JP | 2009-258634 A | 11/2009 |

OTHER PUBLICATIONS

Invitation to Respond to Written Opinion issued Sep. 3, 2013, in Singapore Patent Application No. 201105484-8.
International Search Report, PCT/JP2010/050402, Mar. 16, 2010.
Search Report issued Jul. 13, 2012, in Chinese Patent Application No. 201060003263.5.

* cited by examiner

*Primary Examiner* — Ana Woodward
(74) *Attorney, Agent, or Firm* — Birch, Stewart, Kolasch & Birch, LLP

(57) ABSTRACT

The resin composition of the present invention is a resin composition characterized by including (a) a polyimide, a polybenzoxazole, a polyimide precursor or a polybenzoxazole precursor, (b) 1,5-dihydroxynaphthalene, 1,6-dihydroxynaphthalene, 1,7-dihydroxynaphthalene, or 2,3-dihydroxynaphthalene, and (c) a thermal cross-linking agent having a specific structure. By the use of the resin composition of the present invention, it is possible to reduce the transmittance in the visible region of a cured film while maintaining the transmittance of a resin film before curing.

4 Claims, 2 Drawing Sheets

RESIN COMPOSITION AND DISPLAY DEVICE USING THE SAME

FIELD OF THE INVENTION

The present invention relates to resin compositions. Particularly, it relates to resin compositions suited for applications such as surface protective films and interlayer dielectric films of semiconductor elements, dielectric layers of organic electroluminescent (hereinafter referred to as EL) elements, planarization films of thin film transistor (hereinafter referred to as TFT) substrates for the driving of display devices using organic EL elements, wire-protecting dielectric films of circuit boards, on-chip microlens of solid imaging elements, planarization films for displays and solid imaging elements, and solder resists for circuit boards.

BACKGROUND ART

Cured films produced by curing compositions containing polyimide or polybenzoxazole have been used widely for dielectric films, protective films, planarization films, and the like of semiconductor elements or display devices. Particularly in display devices, it is required to reduce the transmittance of a cured film in order to increase contrast in applications such as, for example, a dielectric layer of an organic EL display and a black matrix of a liquid crystal display. In order to prevent malfunction caused by penetration of light into a TFT for driving of a display device, a leak electric current, and the like, it is required to reduce the transmittance of a dielectric layer of an organic EL device or a planarization film to be provided on a TFT substrate of an organic EL display. Examples of a technology of reducing the transmittance of a visible region greater than a wavelength of 400 nm in a cured film include a method of adding a colorant, such as carbon black, an organic or inorganic pigment, and a dyestuff, to a resin composition like that seen in a black matrix material for liquid crystal displays, an RGB paste material, and the like. Since resin compositions containing such colorants have absorption in a exposure wavelength region of 400 to 450 nm, it is difficult to use them as positive type photosensitive resin compositions which are sensitized by making light reach to a film bottom and therefore the use as a negative type photosensitive resin composition such that a film thereof is photo-cured from its surface is common.

Examples of a technology of reducing the transmittance of a cured film of a positive type photosensitive resin composition include a positive type radiative resin composition comprising an alkali-soluble resin, a quinone diazide compound, and a coloring composition of a leuco dye, a developing agent, and so on (see, for example, patent document 1), a photosensitive resin in which a heat-sensitive material that will become black upon heating has been added beforehand (see, for example, patent document 2), and a positive type photosensitive resin composition comprising an alkali-soluble resin, a quinone diazide compound, a thermally coloring compound that colors upon heating and exhibits an absorbance maximum at 350 nm or more and 700 nm or less, and a compound that has no absorbance maximum at 350 nm or more and less than 500 nm and has an absorbance maximum at 500 nm or more and 750 nm or less (see, for example, patent document 3). These are technologies of reducing the transmittance of a cured film while keeping the transmittance in the exposure wavelength region of the resin film before curing high by using a coloring compound that colors due to energy, such as heat. Therefore, these can impart both positive photosensitivity and negative photosensitivity to resin compositions with high versatility.

PRIOR ART DOCUMENTS

Patent Documents

[Patent Document 1] JP 2008-122501 A
[Patent Document 2] JP 10-170715 A
[Patent Document 3] US Patent Application Publication No. 2004/197703 Specification

SUMMARY OF THE INVENTION

Problems to be Solved by Invention

Coloring compounds are compounds that will have intramolecular structural change themselves due to heat to develop absorption in a specified wavelength region. Recently, not only coloring compounds but also resin compositions capable of developing absorption in an exposure wavelength region by other means have been demanded in order to improve versatility. Then, an object of the present invention is to provide a resin composition that can reduce the transmittance in the visible region of a cured film by the use of a combination of specific compounds while maintaining the transmittance of the resin film before curing.

Means to Solve the Problems

That is, the present invention provides a resin composition comprising (a) a polyimide, a polybenzoxazole, a polyimide precursor, or a polybenzoxazole precursor, (b) 1,5-dihydroxynaphthalene, 1,6-dihydroxynaphthalene, 1,7-dihydroxynaphthalene, or 2,3-dihydroxynaphthalene, and (c) a thermal cross-linking agent having a structure represented by the following formula (1) or a thermal cross-linking agent having a group represented by the following formula (2):

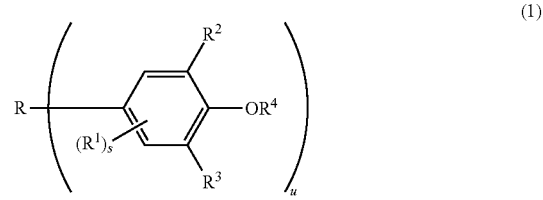

in formula (1), R represents a linking group having 2 to 4 valencies, $R^1$ represents a monovalent organic group having 1 to 20 carbon atoms, Cl, Br, I, or F, $R^2$ and $R^3$ each represent $CH_2OR^5$ ($R^5$ is a hydrogen atom or a monovalent hydrocarbon group having 1 to 6 carbon atoms), $R^4$ represents a hydrogen atom, a methyl group or an ethyl group, s represents an integer of 0 to 2 and u represents an integer of 2 to 4;

wherein in formula (2), $R^6$ represents a hydrogen atom or a monovalent hydrocarbon group having 1 to 6 carbon atoms, t is 1 or 2 and v is 0 or 1, provided that t+v is 1 or 2.

Effect of the Invention

According to the present invention, it is possible to obtain a resin composition that can reduce the transmittance in the visible region of a cured film while maintaining the transmittance of the resin film before curing.

MODE FOR CARRYING OUT THE INVENTION

Figure 1:
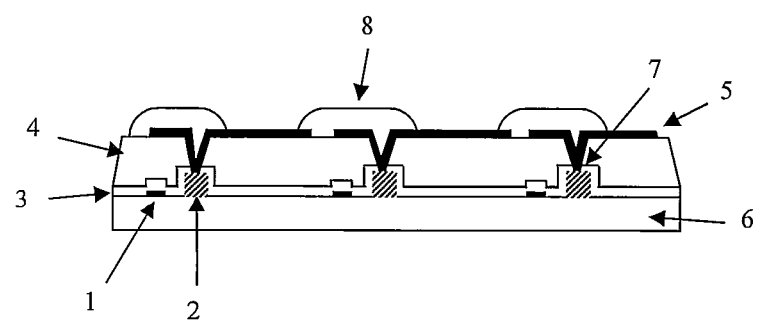
FIG. 1 is a sectional view of a TFT substrate in which a planarization film and a dielectric layer have been formed.

The resin composition of the present invention comprises (a) a polyimide, a polybenzoxazole, a polyimide precursor, or a polybenzoxazole precursor, (b) 1,5-dihydroxynaphthalene, 1,6-dihydroxynaphthalene, 1,7-dihydroxynaphthalene, or 2,3-dihydroxynaphthalene, and (c) a thermal cross-linking agent having a structure represented by the formula (1) provided above or a thermal cross-linking agent having a group represented by the formula (2) provided above. The combination of component (b) and component (c) with the resin of component (a) makes it possible to make a cured film color at 400 to 450 nm to reduce the transmittance in the visible range greatly. Lack of any one of the three compounds (a) to (c) will result in difficulty in the intended coloring at 400 450 nm. The components will be described below.

The resin composition of the present invention includes (a) a polyimide, a polybenzoxazole, a polyimide precursor, or polybenzoxazole precursor. It may include two or more of them and also may include a copolymer that has two or more of their repeating units.

Polyimide and polybenzoxazole are resins that have a cyclic structure of an imide ring or an oxazole ring in their main chain. The number of repetitions of the repeating units is preferably 10 to 100000.

Polyimide can be obtained by reacting a tetracarboxylic acid or its corresponding tetracarboxylic dianhydride or corresponding tetracarboxylic acid diester dichloride with a diamine or its corresponding diisocyanate compound or corresponding trimethylsilylated diamine and it has a tetracarboxylic acid residue and a diamine residue. For example, it can be obtained by dehydration-cyclizing a polyamide acid, which is one of the polyimide precursors produced by making a tetracarboxylic dianhydride react with a diamine, by heating treatment or chemical treatment. In the heating treatment, a solvent that azeotropically boils with water, such as m-xylene, may be added. The heating treatment may be done at a low temperature of equal to or lower than 100° C. with the addition of a weakly acidic carboxylic acid compound. Examples of the cyclization catalyst to be used for the chemical treatment include dehydration condensation agents such as carboxylic anhydrides and dicyclohexyl carbodiimide and bases such as triethylamine. A description of the polyimide precursor will be made later.

Polybenzoxazole can be obtained by making a bisaminophenol compound react with a dicarboxylic acid, its corresponding dicarboxylic acid chloride or corresponding dicarboxylic acid active ester and it has a dicarboxylic acid residue and a bisaminophenol residue. For example, it can be obtained by dehydration-cyclizing a polyhydroxyamide, which is one of the polybenzoxazole precursors produced by making a bisaminophenol compound react with a dicarboxylic acid react, by heating treatment or chemical treatment. In the heating treatment, a solvent that azeotropically boils with water, such as m-xylene, may be added. Moreover, the heating treatment may be done at a low temperature of equal to or lower than 200° C. with the addition of an acidic compound. Examples of the cyclization catalyst to be used for the chemical treatment include phosphoric anhydride, bases, and carbodiimide compounds. A description of the polybenzoxazol precursor will be made later.

In the present invention, from the viewpoint of solubility in an aqueous alkali solution, the polyimide preferably has an acidic group or an acidic group derivative such as $OR^7$, $SO_3R^7$, $CONR^7R^8$, $COOR^7$, and $SO_2NR^7R^8$, in a tetracarboxylic acid residue or a diamine residue, and it more preferably has a hydroxyl group. In addition, the polybenzoxazole preferably has an acidic group or an acidic group derivative, such as $OR^7$, $SO_3R^7$, $CONR^7R^8$, $COOR^7$, and $SO_2NR^7R^8$, in a dicarboxylic acid residue or a bisaminophenol residue, and it more preferably has a hydroxyl group. $R^7$ and $R^8$ each represent a hydrogen atom or a monovalent organic group having 1 to 20 carbon atoms. The acidic group refers to a case where all of $R^7$ or $R^8$ are hydrogen atoms, and the acidic group derivative refers to a case where a monovalent organic group having 1 to 20 carbon atoms is contained in $R^7$ or $R^8$.

In the present invention, examples of preferred structures of a tetracarboxylic acid residue of a polyimide and a dicarboxylic acid residue of a polybenzoxazole (these are hereinafter referred to as an acid residue) include structures provided below or structures resulting from replacing 1 to 4 hydrogen atoms of those structures by an alkyl group having 1 to 20 carbon atoms, a fluoroalkyl group, an alkoxyl group, an ester group, a nitro group, a cyano group, a fluorine atom, or a chlorine atom. Two or more of these may be used together.

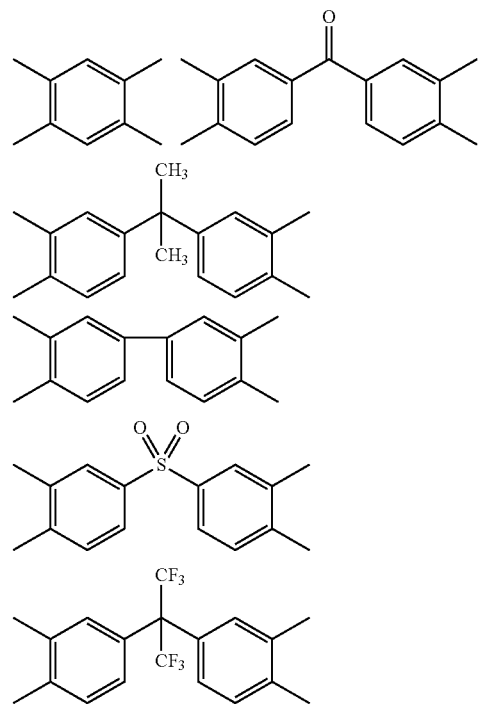

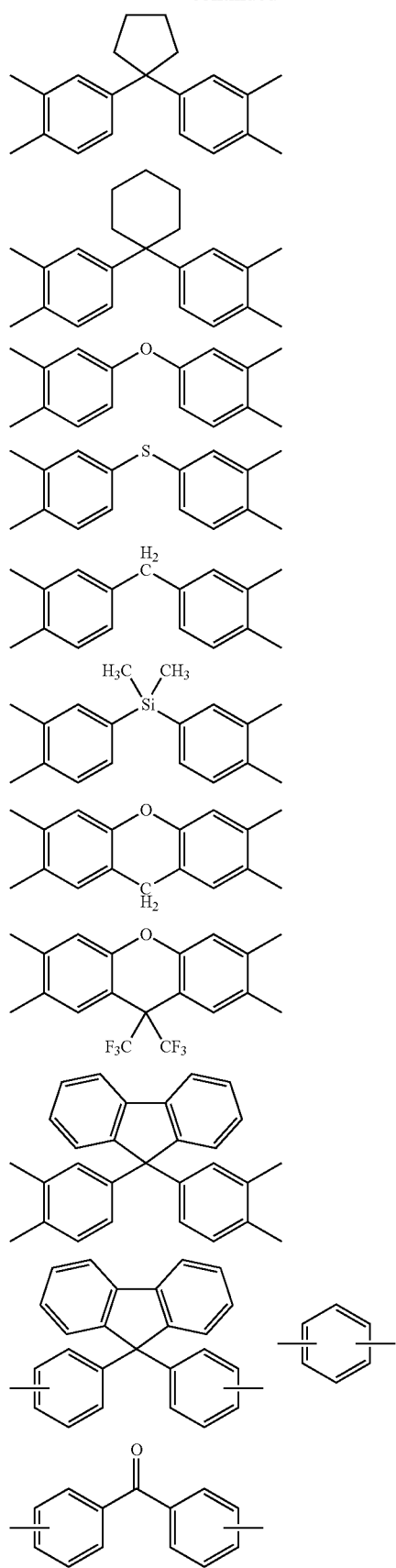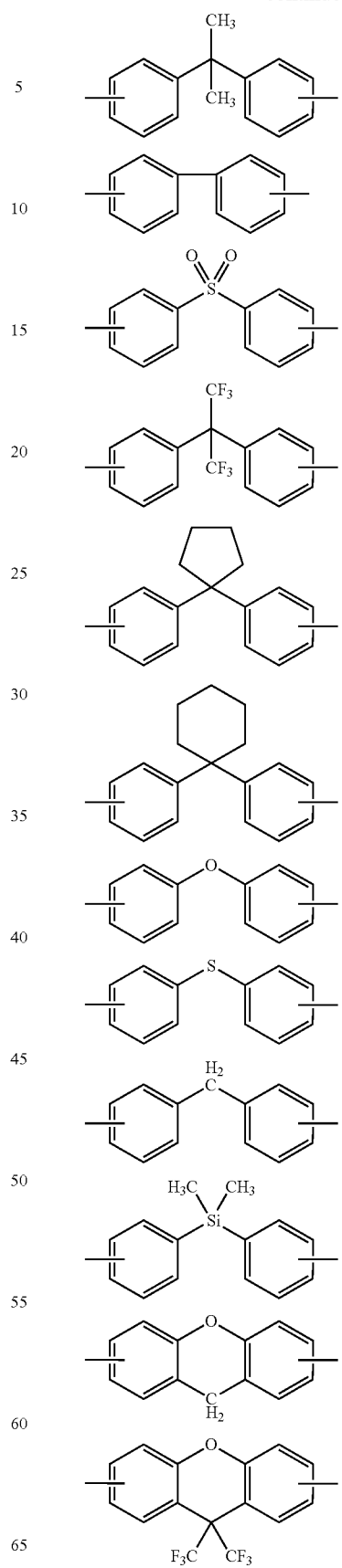

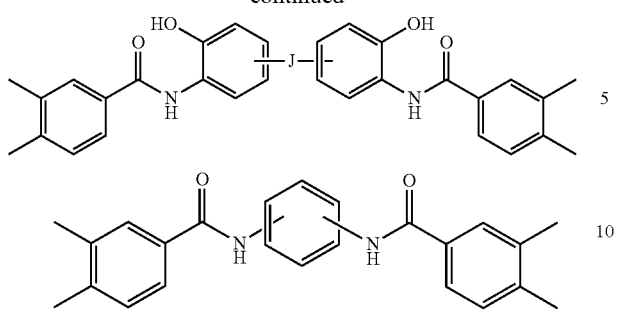

It is noted that J represents a direct bond, —COO—, —CONH—, —CH$_2$—, and —C$_2$H$_4$—, —O—, —C$_3$H$_6$—, —SO$_2$—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$—, or —C$_6$H$_4$—C$_3$F$_6$—C$_6$H$_4$—.

In the present invention, examples of preferred structures of a diamine residue of a polyimide and a bisaminophenol residue of a polybenzoxazole (these are hereinafter referred to as an amine residue) include structures provided below or structures resulting from replacing 1 to 4 hydrogen atoms of those structures by an alkyl group having 1 to 20 carbon atoms, a fluoroalkyl group, an alkoxyl group, an ester group, a nitro group, a cyano group, a fluorine atom, or a chlorine atom. Two or more of these may be used together.

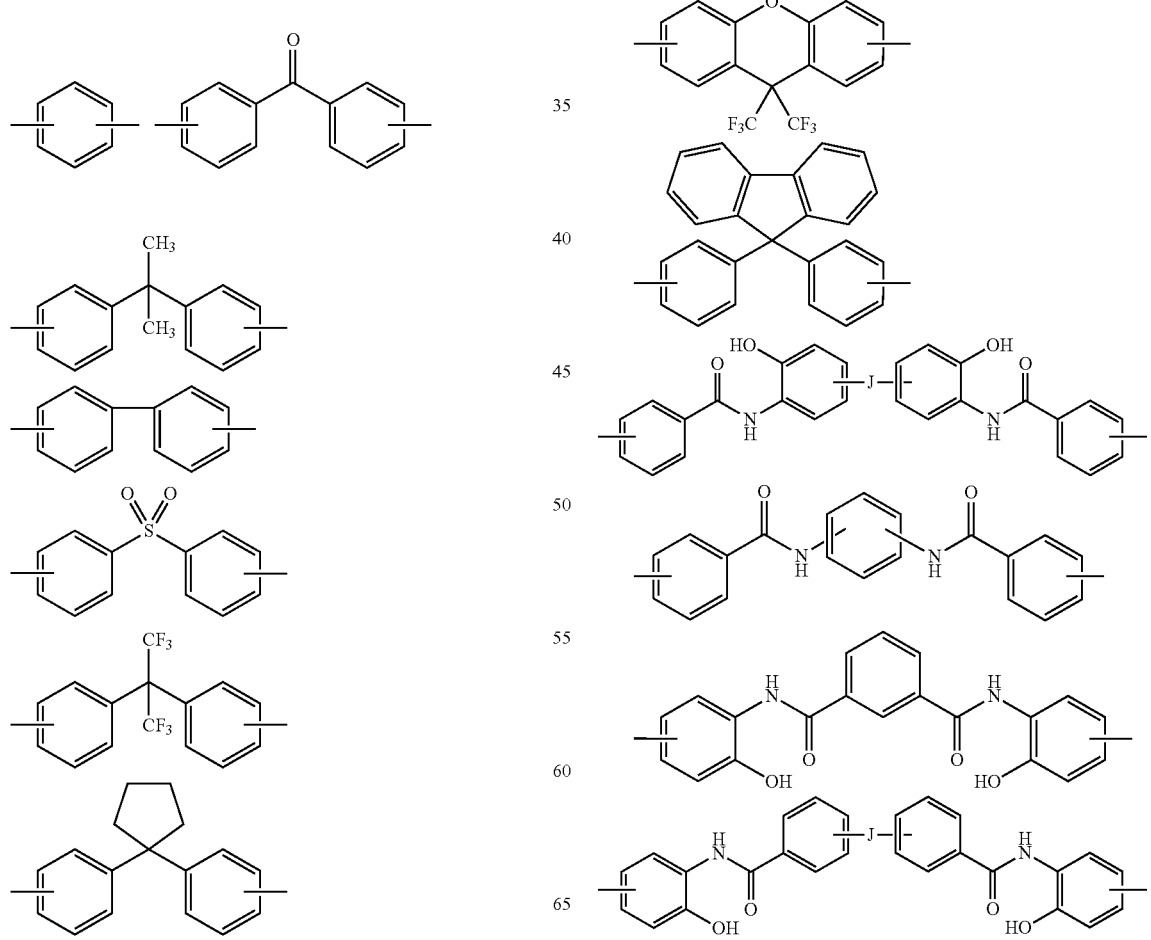

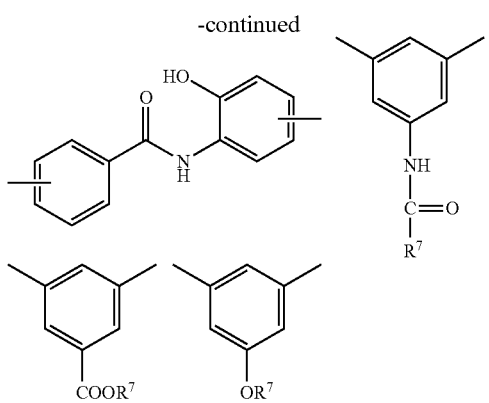

It is noted that J represents a direct bond, —COO—, —CONH—, —CH$_2$—, —C$_2$H$_4$—, —O—, —C$_3$H$_6$—, —SO$_2$—, —S—, —Si(CH$_3$)$_2$—, —O—Si(CH$_3$)$_2$—O—, —C$_6$H$_4$—, —C$_6$H$_4$—O—C$_6$H$_4$—, —C$_6$H$_4$—C$_3$H$_6$—C$_6$H$_4$—, or —C$_6$H$_4$—C$_3$F$_6$—C$_6$H$_4$—. R$^7$ represents a hydrogen atom or a monovalent organic group having 1 to 20 carbon atoms.

Of the component (a) to be used for the present invention, the polyimide precursor and the polybenzoxazole precursor are resins that have an amide bond in their main chain and are dehydration-cyclized by heating treatment or chemical treatment to become the aforementioned polyimide and polybenzoxazole. The number of repetitions of the repeating units is preferably 10 to 100000. Examples of the polyimide precursor include a polyamide acid, a polyamide acid ester, a polyamide acid amide, and a polyisoimide, and a polyamide acid and a polyamide acid ester are preferred. Examples of the polybenzoxazole precursor include a polyhydroxyamide, a polyaminoamide, polyamide, and a polyamide-imide, and a polyhydroxyamide is preferred. In the present invention, from the viewpoint of solubility in an aqueous alkali solution, the polyimide precursor and the polybenzoxazole precursor preferably have an acidic group or an acidic group derivative such as OR$^7$, SO$_3$R$^7$, CONR$^7$R$^8$, COOR$^7$, and SO$_2$NR$^7$R$^8$, in an acid residue or an amine residue, and they more preferably have a hydroxyl group. R$^7$ and R$^8$ represent hydrogen atoms or monovalent organic groups having 1 to 20 carbon atoms. The acidic group refers to a case where all of R$^7$ or R$^8$ are hydrogen atoms, and the acidic group derivative refers to a case where a monovalent organic group having 1 to 20 carbon atoms is contained in R$^7$ or R$^8$.

Regarding the acid component that constitutes the acid residue of the polyimide precursor and the polybenzoxazole precursor, examples of a dicarboxylic acid include terephthalic acid, isophthalic acid, diphenylether dicarboxylic acid, bis(carboxyphenyl)hexafluoropropane, biphenyldicarboxylic acid, benzophenone dicarboxylic acid, and triphenyldicarboxylic acid. Example of a tricarboxylic acid include trimellitic acid, trimesic acid, diphenyl ether tricarboxylic acid, and biphenyl tricarboxylic acid. Examples of a tetracarboxylic acid include aromatic tetracarboxylic acids, such as pyromellitic acid, 3,3',4,4'-biphenyl tetracarboxylic acid, 2,3,3',4'-biphenyl tetracarboxylic acid, 2,2',3,3'-biphenyl tetracarboxylic acid, 3,3',4,4'-benzophenonetetracarboxylic acid, 2,2',3,3'-benzophenone tetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid and 3,4,9,10-perylene tetracarboxylic acid, and aliphatic tetracarboxylic acids, such as butanetetracarboxylic acid, a cyclobutanetetracarboxylic acid, 1,2,3,4-cyclopentanetetracarboxylic acid, cyclohexanetetracarboxylic acid, bicyclo[2.2.1.]heptanetetracarboxylic acid, bicyclo[3.3.1.]tetracarboxylic acid, bicyclo[3.1.1.]hept-2-ene tetracarboxylic acid, bicyclo[2.2.2.]octane tetracarboxylic acid, and adamantane tetracarboxylic acid. Two or more of these may be used together. More preferred are the dicarboxylic acids, tricarboxylic acids or tetracarboxylic acids provided above as examples whose 1 to 4 hydrogen atoms have been substituted with an acidic group or acidic group derivative, such as OR$^7$, SO$_3$R$^7$, CONR$^7$R$^8$, COOR$^7$, and SO$_2$NR$^7$R$^8$, preferably with a hydroxyl group, a sulfonic acid group, a sulfonic acid amide group, or a sulfonic acid ester group.

These acids each can be used as it is or in the form of an acid anhydride or an active ester.

By the use of a silicon atom-containing tetracarboxylic acid such as dimethylsilanediphthalic acid and 1,3-bis(phthalic acid)tetramethyldisiloxane, it is possible to enhance the adhesion property to a substrate and the resistance to oxygen plasma to be used for washing and resistance to a UV ozone treatment. These silicon atom-containing tetracarboxylic acids are preferably used in 1 to 30 mol % of the whole acid component.

Examples of the diamine component that constitutes the amine residue of the polyimide precursor and the polybenzoxazole precursor include hydroxyl group-containing diamines, such as bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, bis(3-amino-4-hydroxyphenyl)fluorene, carboxyl group-containing diamines, such as 3,5-diaminobenzoic acid and 3-carboxy-4,4'-diaminodiphenyl ether, sulfonic acid-containing diamines, such as 3-sulfonic acid-4,4-diaminodiphenyl ether, dithiohydroxyphenylenediamine, 3,4'-diaminodiphenyl ether, 4,4'-diaminodiphenyl ether, 3,4'-diaminodiphenylmethane, 4,4'-diaminodiphenylmethane, 3,4'-diaminodiphenyl sulfone, 4,4'-diaminodiphenyl sulfone, 3,4'-diaminodiphenylsulfide, 4,4'-diaminodiphenylsulfide, 1,4-bis(4-aminophenoxy)benzine, m-phenylenediamine, p-phenylenediamine, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, or compounds each resulting from replacing some halogen atoms of the aromatic ring of each of the foregoing by an alkyl group or a halogen atom, aliphatic diamines, such as cyclohexyldiamine and methylenebiscyclohexylamine. Furthermore, these diamines may be substituted with an alkyl group having 1 to 10 carbon atoms, such as a methyl group and an ethyl group, a fluoroalkyl group having 1 to 10 carbon atoms, such as a trifluoromethyl group, or a group such as F, Cl, Br, and I. Two or more of these may be used together. For an application in which heat resistance is required, it is preferred to use an aromatic diamine in 50 mol % or more of the whole diamine. In addition, the diamines provided above as examples preferably have an acidic group or an acidic group derivative, such as $OR^7$, $SO_2R^7$, $CONR^7R^8$, $COOR^7$, and $SO_2NR^7R^8$, and they more preferably have a hydroxyl group.

These diamines can be used as they are or in the form of a corresponding diisocyanate compound or trimethylsilylated diamine.

The use of a silicon atom-containing diamine, such as 1,3-bis(3-aminopropyl) tetramethyldisiloxane and 1,3-bis(4-anilino) tetramethyldisiloxane, as a diamine component can enhance adhesion property to a substrate or resistance to oxygen plasma to be used for washing and resistance to a UV ozone treatment. These silicon atom-containing diamines are preferably used in 1 to 30 mol % of the whole diamine component.

It is preferred to cap the end of a polyimide, a polybenzoxazole, a polyimide precursor, or a polybenzoxazole precursor with a monoamine having a hydroxyl group, a carboxyl group, a sulfonic acid group, or a thiol group, an acid anhydride, an acid chloride, or a monocarboxylic acid. Two or more of these may be used together. The dissolution rate of a resin to an aqueous alkali solution can be adjusted easily to a preferable range by the possession of the aforementioned group at a resin end.

Preferable examples of a monoamine include 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, and 4-aminothiophenol.

Preferable examples of the acid anhydride, the monoacid chloride, the monocarboxylic acid, and the mono-active ester compound include acid anhydrides, such as phthalic anhydride, maleic anhydride, nasic acid, cyclohexane dicarboxylic acid anhydride, and 3-hydroxyphthalic acid anhydride; monocarboxylic acids, such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, and 4-carboxybenzenesulfonic acid, and monoacid chloride compounds resulting from conversion of their carboxyl groups to acid chlorides; monoacid chloride compounds resulting from conversion of one carboxyl group of a dicarboxylic acid, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, and 2,6-dicarboxynaphthalene, into an acid chloride; and mono-active ester compounds obtained through a reaction between a monoacid chloride compound and N-hydroxybenzotriazole or N-hydroxy-5-norbornene-2,3-dicarboxylmide.

The content of the end-capping agent, such as the aforementioned monoamine, acid anhydride, acid chloride, and monocarboxylic acid, is preferably within a range of 0.1 to 60 mol %, more preferably from 5 to 50 mol %, of the number of moles of the charged acid component monomer to constitute an acid residue or the charged diamine component monomer to constitute an diamine residue. By adjusting the content to such a range, a resin composition that is moderate in viscosity of its solution when applying the resin composition and that has superior film properties can be obtained.

The resin also may have a polymerizable functional group at its end. Examples of the polymerizable functional group include an ethylenically unsaturated linking group, an acetylene group, a methylol group, and an alkoxymethyl group.

The end-capping agent having been introduced into a resin can be detected easily by the following method. For example, an end-capping agent can be detected easily by dissolving a resin into which the end-capping agent has been introduced in an acidic solution to decompose the resin into an amine component and an acid component which are constitutional units of the resin, and then measuring them by gas chromatography (GC) or NMR. Aside from this, a resin in which an end-capping agent has been introduced can be detected directly through the measurement of a pyrolysis gas chromatograph (PGC), an infrared spectrum, and $^{13}C$-NMR.

In the present invention, a polyimide precursor or a polybenzoxazole precursor is preferred as component (a) and a polyimide precursor is more preferred. A polyimide precursor advances an imidation reaction in which an amide acid moiety is cyclized by curing calcination at about 200° C., and a polybenzoxazole precursor advances an oxazolation reaction in which a hydroxyamide moiety is cyclized by curing calcination at about 300° C., resulting in remarkable improvement in chemical resistance. The polyimide precursor makes it possible to obtain chemical resistance at a lower calcination temperature. A photosensitive resin composition using such a precursor resin having a property to volumetrically shrink at the time of curing calcination makes it possible to obtain a pattern in a forward-tapered form by obtaining a fine pattern by an exposure-development step and then performing calcination. This pattern in a forward-tapered form is superior in ability to cover an upper electrode when being used as a dielectric film of an organic EL element, and it can prevent breakage of wiring and can improve the reliability of an element.

The resin composition of the present invention may contain alkali-soluble resins other than component (a). An alkali-soluble resin refers to any resin having an acidic group to become soluble in alkali and specific examples thereof include radically polymerizable polymers having acrylic acid, a phenol novolak resin, and polyhydroxystyrene, polysiloxane. It is also permitted to adjust the alkali solubility by protecting the acidic groups of these resins. Such a resin is a substance that is soluble in an aqueous solution of an alkali, such as choline, triethylamine, dimethylaminopyridine, monoethanolamine, diethylaminoethanol, sodium hydroxide, potassium hydroxide, and sodium carbonate as well as tetramethylammonium hydroxide. Although two or more such resins may be contained, their proportion to the whole resin including component (a) is preferably up to 50% by weight.

The resin composition of the present invention contains (b) 1,5-dihydroxynaphthalene, 1,6-dihydroxynaphthalene, 1,7-dihydroxynaphthalene, or 2,3-dihydroxynaphthalene. Two or more of these may be contained. The possession of two hydroxyl groups results in better alkali developability in comparison to a case of possessing one hydroxyl group and can improve photosensitivity. The naphthalene structure, which is a fused polycyclic structure, is higher in electron density than a monocyclic compound and it comes to have an increased electron density through its possession of two hydrogen groups and can effectively cause an electrophilic addition reaction of a thermal cross-linking agent (c) described later.

Moreover, the conjugation of π-electrons is prone to spread in two or more directions to develop color after the formation of a cross-linking reaction, and therefore, it is possible to greatly reduce the transmittance in the visible region of a cured film by combining it with a thermal cross-linking agent (c) described later. Such an effect becomes particularly remarkable when the structure has hydroxyl groups at 1,5-positions, 1,6-positions, 1,7-positions, or 2,3-positions. Moreover, by a cross-linking reaction of the thermal cross-linking agent (c) and the above-mentioned component (a), it is possible to fix the compound of component (b) to component (a), which is superior in heat resistance, so that the chemical resistance of a cured film can be improved.

The resin composition of the present invention may contain, in addition to (b) 1,5-dihydroxynaphthalene, 1,6-dihydroxynaphthalene, 1,7-dihydroxynaphthalene, or 2,3-dihydroxynaphthalene, another fused polycyclic aromatic compound having two or more hydroxyl groups.

Examples of the skeleton structure of the fused polycyclic aromatic compound having two or more hydroxyl groups include carbon fused bicyclic structure, such as pentalene, indene, naphthalene, azulene, heptalene, and octalene, carbon fused tricyclic structure, such as as-indacene, s-indacene, biphenylene, acenaphthylene, fluorene, phenanthrene, and anthracene, carbon fused tetracyclic structure, such as trindene, fluoranthene, acephenanthrylene, aceanthrylene, triphenylene, pyrene, chrysene, tetraphene, and naphthacene, and carbon fused pentacyclic structure, such as picene, perylene, pentaphene, pentacene, and tetraphenylene. A heterocyclic structure containing nitrogen, sulfur, or oxygen atoms instead of some carbon atoms of the aforementioned carbon fused polycyclic aromatic compounds is also available. Examples of the fused polycyclic aromatic heterocompound include fused heterobicyclic compounds, such as benzofuran, benzothiophene, indole, benzimidazole, benzothiazole, purine, quinoline, isoquinoline, cinnoline, and quinoxaline, and fused heterotricyclic compounds, such as dibenzofuran, carbazole, acridine, and 1,10-phenanthroline. Compounds each resulting from replacing some hydrogen atoms of a compound having a skeleton provided above as an example by two or more hydroxyl groups are preferred as the fused polycyclic aromatic compound having two or more hydroxyl groups.

Specific examples of the fused polycyclic aromatic compound having two or more hydroxyl groups include 1,4-dihydroxynaphthalene, 2,6-dihydroxynaphthalene, 2,7-dihydroxynaphthalene, 1,8-dihydroxynaphthalene, 2,4-dihydroxyquinoline, 2,6-dihydroxyquinoline, 2,3-dihydroxyquinoxaline, anthracene-1,2,10-triol, and anthracene-1,8,9-triol.

In the resin composition of the present invention, the content of (b) 1,5-dihydroxynaphthalene, 1,6-dihydroxynaphthalene, or 1,7-dihydroxynaphthalene is preferably 5 parts by weight or more, more preferably 10 parts by weight or more relative to 100 parts by weight of the resin of component (a). It is preferably 120 parts by weight or less, and more preferably 100 parts by weight or less. If the content of component (b) is 5 parts by weight or more, the transmittance in the visible region of a cured film can be reduced more. If it is 120 parts by weight or less, it is possible to maintain the strength of a cured film and reduce the percentage of water absorption. When containing two or more kinds of component (a) or component (b), their total amount is preferably within the above-mentioned range.

The resin composition of the present invention contains (c) a thermal cross-linking agent having a structure represented by the following formula (1) or a thermal cross-linking agent having a group represented by the following formula (2). Two or more of these may be contained. The thermal cross-linking agent of component (c) can reduce the transmittance of the visible range greatly by cross-linking itself to both (a) a polyimide, a polybenzoxazole, a polyimide precursor, or a polybenzoxazole precursor, and (b) 1,5-dihydroxynaphthalene, 1,6-dihydroxynaphthalene, 1,7-dihydroxynaphthalene, or 2,3-dihydroxynaphthalene, thereby linking the three components (a), (b), and (c) together. Moreover, it can increase the chemical resistance of a cured film through a cross-linking reaction.

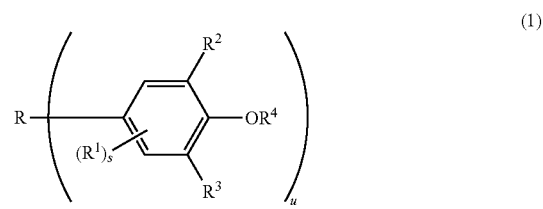

In formula (1), R represents a linking group having 2 to 4 valencies. $R^1$ represents a monovalent organic group having 1 to 20 carbon atoms, Cl, Br, I, or F. Monovalent hydrocarbon groups having 1 to 6 carbon atoms, such as a methyl group, an ethyl group, a propyl group, a butyl group, a pentyl group, a hexyl group, a cyclopentyl group, and a cyclohexyl group, are preferred as the monovalent organic group having 1 to 20 carbon atoms. $R^2$ and $R^3$ each represent $CH_2OR^5$ ($R^5$ is a hydrogen atom or a monovalent hydrocarbon group having 1 to 6 carbon atoms). $R^4$ represents a hydrogen atom, a methyl group or an ethyl group. s represents an integer of 0 to 2 and u represents an integer of 2 to 4. A plurality of $R^1$s to $R^4$s each may be the same or different. Examples of the linking group R are provided below.

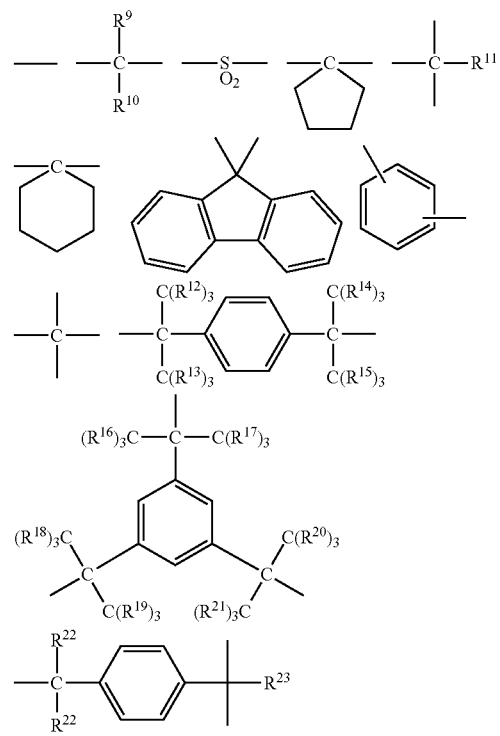

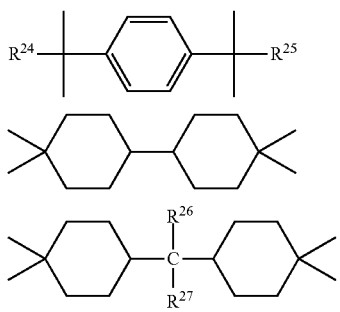

In the above formula, $R^9$ to $R^{27}$ each represent a hydrogen group, a monovalent organic group having 1 to 20 carbon atoms, Cl, Br, I, or F. A methyl group, an ethyl group, a propyl group, a butyl group, a pentyl group, a hexyl group, a cyclopentyl group, a cyclohexyl group, a benzyl group, and a naphthyl group are preferred as the monovalent organic group having 1 to 20 carbon atoms.

  (2)

In the above formula (2), $R^6$ represents a hydrogen atom or a monovalent hydrocarbon group having 1 to 6 carbon atoms. t represents 1 or 2 and v represents 0 or 1, provided that t+v is 1 or 2.

In the above formula (1), $R^2$ and $R^3$ each represent a thermally cross-linkable group, $CH_2OR^5$ ($R^5$ is a hydrogen atom or a monovalent hydrocarbon group having 1 to 6 carbon atoms). $R^5$ is preferably a monovalent hydrocarbon group having 1 to 4 carbon atoms because it leaves a moderate reactivity and excels in storage stability. In a photosensitive resin composition containing a photo acid generator, a photopolymerization initiator, or the like, $R^5$ is more preferably a methyl group or an ethyl group.

In the thermal cross-linking agent represented by formula (1), the number of the functional groups of the thermally cross-linkable groups accounting for in one molecule is 4 to 8. If the number of the functional groups is less than 4, it is impossible to color the resin composition after curing moderately and also impossible to reduce the transmittance in the visible region of a cured film. On the other hand, if the number of the functional groups exceeds 8, it is difficult to obtain a compound that is high in purity and the stability of the compound itself and the storage stability in a resin composition deteriorate.

The purity of the compound having a structure represented by formula (1) is preferably 75% or more, and more preferably 85% or more. If the purity is 85% or more, the storage stability is good, a cross-linking reaction of a resin composition is fully carried out, resulting in a superior coloring property after curing, and it is possible to reduce the transmittance in the visible region of a cured film. Since it is possible to reduce unreacted groups, that serve as water-absorptive groups, it is possible to reduce the water absorptivity of a resin composition. Examples of the method for obtaining a thermal cross-linking agent having a high purity include recrystallization and distillation. The purity of the thermal cross-linking agent can be determined by liquid chromatography.

Preferable examples of the thermal cross-linking agent having a structure represented by formula (1) are given below.

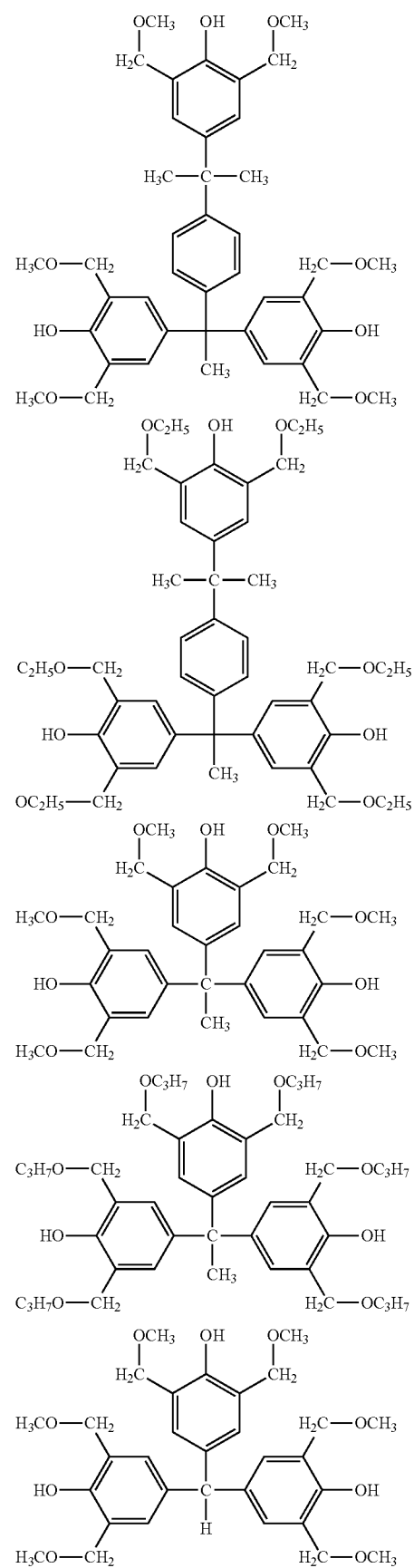

-continued

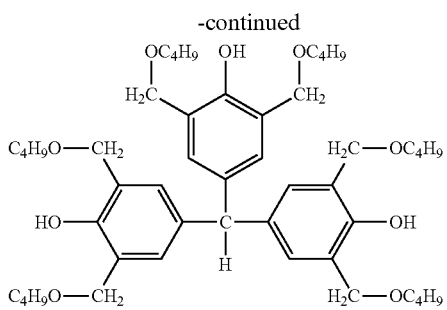

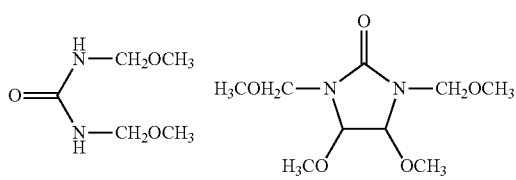

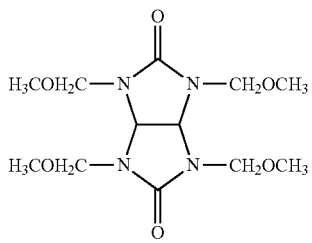

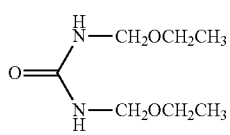

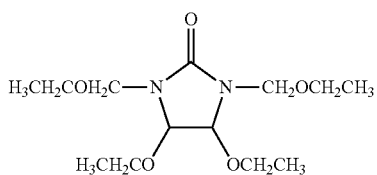

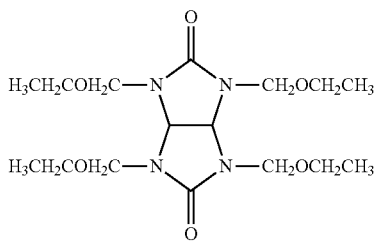

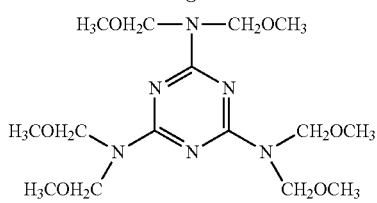

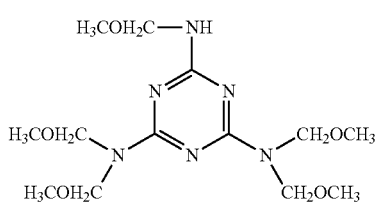

-continued

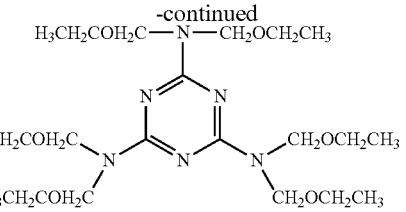

In formula (2), $R^6$, which is a hydrogen atom or a monovalent hydrocarbon group having 1 to 6 carbon atoms, preferably is a monovalent hydrocarbon group having 1 to 4 carbon atoms. From the viewpoint of the stability of a compound or the storage stability in a resin composition, it is preferred, in a photosensitive resin composition containing a photo acid generator, a photopolymerization initiator, or the like, that $R^6$ be a methyl group or an ethyl group and it is preferred that the number of the ($CH_2OR^6$) groups contained in the compound be 8 or less.

Preferable examples of the thermal cross-linking agent having a group represented by formula (2) are given below.

[kagaku 10]

The content of (c) the thermal cross-linking agent having a structure represented by formula (1) or the thermal cross-linking agent having a group represented by formula (2) is preferably 5 parts by weight or more and more preferably is 10 parts by weight or more relative to 100 parts by weight of the resin of component (a). It is preferably 120 parts by weight or less, and more preferably 100 parts by weight or less. If the content of component (c) is 5 parts by weight or more, the transmittance in the visible region of a cured film can be reduced more. If it is 120 parts by weight or less, the strength of a cured film is high and also the resin composition is superior in storage stability. When containing two or more kinds of component (a) or component (c), their total amount is preferably within the above-mentioned range.

The resin composition of the present invention may further comprise (d) a photo acid generator, or (e) a photopolymerization initiator and (f) a compound having two or more ethylenically unsaturated bonds and can impart positive type or negative type photosensitivity.

Due to the inclusion of (d) the photo acid generator in the resin composition of the present invention, an acid is generated by in a part exposed to light, so that the solubility of a part exposed to light in an aqueous alkali solution increases and a positive type relief pattern in which the part exposed to light dissolves can be obtained. Moreover, the inclusion of (d) the photo acid generator and an epoxy compound makes it possible to obtain a negative type relief pattern in which acids generated in a part exposed to light promotes the reaction of the epoxy compound, so that the part exposed to light becomes insoluble.

Examples of (d) the photo acid generator include quinone diazide compounds, sulfonium salts, phosphonium salts, diazonium salts, and iodonium salts.

Examples of the quinone diazide compound include a compound in which the sulfonic acid of quinone diazide has been bonded to a polyhydroxy compound via an ester, a compound in which the sulfonic acid of quinone diazide has been sulfonamide-bonded to a polyamino compound, and a compound in which the sulfonic acid of quinone diazide has been ester-bonded and/or sulfonamide-bonded to a polyhydroxy-polyamino compound. It is preferred that 50 mol % or more of the whole functional groups of such a polyhydroxy compound or polyamino compound have been substituted with quinone diazide. It is preferred that two or more kinds of photo acid generators (d) be contained and a highly photosensitive resin composition can be obtained.

In the present invention, a quinone diazide compound that has any of a 5-naphthoquinone diazide sulfonyl group and a 4-naphthoquinone diazide sulfonyl group is preferably used. A 4-naphthoquinonediazide sulfonyl ester compound is suitable for i-line exposure because it has an absorption in the i-line region of a mercury lamp. A 5-naphthoquinonediazide sulfonyl ester compound is suitable for g-line exposure because it has an absorption extending to the g-line region of a mercury lamp. In the present invention, it is preferred to choose a 4-naphthoquinonediazide sulfonyl ester compound and a 5-naphthoquinonediazide sulfonyl ester compound depending upon the wavelength of light to be applied. A naphthoquinonediazide sulfonyl ester compound that has a 4-naphthoquinone diazide sulfonyl group and a 5-naphthoquinone diazide sulfonyl group in the same molecule may be contained, and both a 4-naphthoquinonediazide sulfonyl ester compound and a 5-naphthoquinonediazide sulfonyl ester compound may be contained.

Among photo acid generators (d), sulfonium salt, phosphonium salts, diazonium salts are preferred because they moderately stabilize the acid component generated by exposure to light. Particularly, sulfonium salts are preferred.

In the present invention, from the viewpoint of enhancement in sensitivity, the content of the photo acid generator (d) is preferably 0.01 to 50 parts by weight relative to 100 parts by weight of the resin of component (a). Among these, the range of 3 to 40 parts by weight is preferred for a quinone diazide compound. The total amount of the sulfonium salt, the phosphonium salt, and the diazonium salt is preferably within the range of 0.5 to 20 parts by weight. Furthermore, a sensitizing agent or the like can also be contained according to need. When containing two or more kinds of component (d), their total amount is preferably within the above-mentioned range.

The photosensitive resin composition of the present invention may further comprise (e) a photopolymerization initiator and (f) a compound having two or more ethylenically unsaturated bonds. It is possible to obtain a negative type relief pattern in which active radicals generated in the part exposed to light advance the radical polymerization of ethylenically unsaturated bonds, so that the part exposed to light becomes insoluble.

Examples of (e) the photopolymerization initiator include diethoxyacetophenone, 2-hydroxy-2-methyl-1-phenylpropan-1-one, benzyl dimethyl ketal, 1-(4-isopropylphenyl)-2-hydroxy-2-methylpropan-1-one, 4-(2-hydroxyethoxy)phenyl-(2-hydroxy-2-propyl) ketone, 1-hydroxycyclohexylphenyl ketone, 1-phenyl-1,2-propanedione-2-(o-ethoxycarbonyl)oxime, 2-methyl-[4-(methylthio)phenyl]-2-morpholinopropan-1-one, 2-benzyl-2-dimethylamino-1-(4-morpholinophenyl)-butanone-1, benzoin, benzoin methyl ether, benzoin ethyl ether, benzoin isopropyl ether, benzoin isobutyl ether, benzophenone, methyl o-benzoylbenzoate, 4-phenylbenzophenone, 4,4-dichlorobenzophenone, hydroxybenzophenone, 4-benzoyl-4'-methyl-diphenyl sulfide, alkylated benzophenone, 3,3',4,4'-tetra(tert-butylperoxycarbonyl)benzophenone, 4-benzoyl-N,N-dimethyl-N-[2-(1-oxo-2-propenyloxy)ethyl]benzene methanaminium bromide, (4-benzoylbenzyl)trimethylammonium chloride, 2-hydroxy-3-(4-benzoylphenoxy)-N,N,N-trimethyl-1-propene aminium chloride monohydrate, 2-isopropylthioxanthone, 2,4-dimethylthioxanthone, 2,4-diethylthioxanthone, 2,4-dichlorothioxanthone, 2-hydroxy-3-(3,4-dimethyl-9-oxo-9H-thioxanthen-2-yloxy)-N,N, N-trimethyl-1-propanaminium chloride, 2,4,6-trimethylbenzoylphenylphosphine oxide, 1,2-octanedione-1-[4-(phenylthio)-2-(O-benzoyloxime)], ethanone, 1-[9-ethyl-6-(2-methylbenzoyl)-9H-carbazol-3-yl]-, 1-(0-acetyloxime), 2,2'-bis (o-chlorophenyl)-4,5,4',5'-tetraphenyl-1,2-biimidazole, 10-butyl-2-chloroacridone, 2-ethylanthraquinone, benzil, 9,10-phenanthrenequinone, camphorquinone, methylphenylglyoxy ester, η5-cyclopentadienyl-eta6-cumenyl-iron (1+)-hexafluorophosphate(1−), diphenylsulfide derivatives, bis(η5-2,4-cyclopentadien-1-yl)-bis(2,6-difluoro-3-(1H-pyrrol-1-yl)-phenyl) titanium 4,4-bis(dimethylamino) benzophenone, 4,4-bis(diethylamino)benzophenone, thioxanthone, 2-methylthioxanthone, 2-chlorothioxanthone, 4-benzoyl-4-methylphenyl ketone, dibenzyl ketone, fluorenone, 2,3-diethoxyacetophenone, 2,2-dimethoxy-2-phenyl-2-phenylacetophenone, 2-hydroxy-2-methylpropiophenone, p-t-butyldichloroacetophenone, benzilmethoxyethyl acetal, anthraquinone, 2-tert-butyl anthraquinone, 2-aminoanthraquinone, β-chloroanthraquinone, anthrone, benzanthrone, dibenzsuberone, methyleneanthrone, 4-azidobenzalacetophenone, 2,6-bis(p-azidobenzyliene)cyclohexane, 2,6-bis(p-azidobenzyliene)-4-methylcyclohexanone, 2-phenyl-1,2-butadione-2-(o-methoxycarbonyl) oxime, 1,3-diphenylpropanetrione-2-(o-ethoxycarbonyl) oxime, naphthalenesulfonyl chloride, quinolinesulfonyl chloride, N-phenylthioacridone, 4,4-azobisisobutyronitrile, benzthiazole disulfide, triphenylphosphine, tetrabromocarbon, tribromophenylsulfone, benzoyl peroxide, and combinations of photoreductive dyes, such as eosin and methylene blue, and reducing agent, such as ascorbic acid and triethanolamine. Two or more of these may be contained.

In the present invention, the content of the photopolymerization initiator (e) is preferably 0.1 to 20 parts by weight relative to 100 parts by weight of the resin of component (a). If it is 0.1 parts by weight or more, a sufficient amount of radical is generated by irradiation with light and photosensitivity increases. If it is 20 parts by weight or less, curing of a part unexposed to light caused by the generation of excessive radicals does not occur, resulting in increase in alkali developability. When containing two or more kinds of component (e), their total amount is preferably within the above-mentioned range.

Examples of the compound having two or more ethylenically unsaturated bonds (f) include acrylic monomers such as ethylene glycol dimethacrylate, ethylene glycol diacrylate, diethylene glycol dimethacrylate, trimethylolpropane triacrylate, ethoxylated bisphenol A dimethacrylate, glycerin dimethacrylate, tripropylene glycol dimethacrylate, butanediol dimethacrylate, glycerin triacrylate, pentaerythritol triacrylate, pentaerythritol tetraacrylate, dipentaerythritol hexaacrylate, ethoxylated pentaerythritol tetraacrylate, and ethoxylated isocyanuric acid triacrylate. Two or more of these may be contained.

In the present invention, the content of the compound having two or more ethylenically unsaturated bonds (f) is preferably 1 part by weight or more, and more preferably 5 parts by weight of more relative to 100 parts by weight of the resin of component (a). It is preferably 100 parts by weight or less, and more preferably 50 parts by weight or less. When containing two or more kinds of component (f), their total amount is preferably within the above-mentioned range.

For the purpose of adjustment of solubility or the like, a compound having only one ethylenically unsaturated bond may be contained in an amount of 1 to 50 parts by weight relative to 100 parts by weight of the resin of component (a). Examples of such a compound include acrylic acid, methacrylic acid, methyl acrylate, methyl methacrylate, butyl acrylate, hydroxyethyl acrylate, hydroxyethyl methacrylate, dimethylacrylamide, dimethylaminoethyl methacrylate, acryloylmorpholin, 1-hydroxyethyl alpha-chloroacrylate, 2-hydroxyethyl methacrylate, 2-hydroxyethyl acrylate, 2-hydroxyethyl α-chloroacrylate, 1-hydroxypropyl methacrylate, 1-hydroxypropyl acrylate, 1-hydroxypropyl α-chloroacrylate, 2-hydroxypropyl methacrylate, 2-hydroxypropyl acrylate, 2-hydroxypropyl α-chloroacrylate, 3-hydroxypropyl methacrylate, 3-hydroxypropyl acrylate, 3-hydroxypropyl α-chloroacrylate, 1-hydroxy-1-methylethyl methacrylate, 1-hydroxy-1-methylethyl acrylate, 1-hydroxy-1-methylethyl α-chloroacrylate, 2-hydroxy-1-methylethyl methacrylate, 2-hydroxy-1-methylethyl acrylate, 2-hydroxy-1-methylethyl α-chloroacrylate, 1-hydroxybutyl methacrylate, 1-hydroxybutyl acrylate, 1-hydroxybutyl α-chloroacrylate, 2-hydroxybutyl methacrylate, 2-hydroxybutyl acrylate, 2-hydroxybutyl α-chloroacrylate, 3-hydroxybutyl methacrylate, 3-hydroxybutyl acrylate, 3-hydroxybutyl α-chloroacrylate, 4-hydroxybutyl methacrylate, 4-hydroxybutyl acrylate, 4-hydroxybutyl α-chloroacrylate, 1-hydroxy-1-methylpropyl methacrylate, 1-hydroxy-1-methylpropyl acrylate, 1-hydroxy-1-methylpropyl α-chloroacrylate, 2-hydroxy-1-methylpropyl methacrylate, 2-hydroxy-1-methylpropyl acrylate, 2-hydroxy-1-methylpropyl α-chloroacrylate, 1-hydroxy-2-methylpropyl methacrylate, 1-hydroxy-2-methylpropyl acrylate, 1-hydroxy-2-methylpropyl α-chloroacrylate, 2-hydroxy-2-methylpropyl methacrylate, 2-hydroxy-2-methylpropyl acrylate, 2-hydroxy-2-methylpropyl α-chloroacrylate, 2-hydroxy-1,1-dimethylethyl methacrylate, 2-hydroxy-1,1-dimethylethyl acrylate, 2-hydroxy-1,1-dimethylethyl α-chloroacrylate, 1,2-dihydroxypropyl methacrylate, 1,2-dihydroxypropyl acrylate, 1,2-dihydroxypropyl α-chloroacrylate, 2,3-dihydroxypropyl methacrylate, 2,3-dihydroxypropyl acrylate, 2,3-dihydroxypropyl α-chloroacrylate, 2,3-dihydroxybutyl methacrylate, 2,3-dihydroxybutyl acrylate, 2,3-dihydroxybutyl α-chloro acrylate, p-hydroxystyrene, p-isopropenylphenol, phenethyl methacrylate, phenethyl acrylate, phenethyl α-chloroacrylate, N-methylolacrylamide, N-methylolmethacrylamide, α-chloroacrylic acid, crotonic acid, 4-pentenoic acid, 5-hexenoic acid, 6-heptenoic acid, 7-octenoic acid, 8-nonanoic acid, 9-decanoic acid, 10-undecylenic acid, brassidic acid, ricinoleic acid, 2-(methacryloxy)ethyl isocyanate, 2-(acryloyloxy)ethyl isocyanate, and 2-(α-chloroacryloyloxy)ethylisocyanate. Two or more of these may be contained.

The resin composition of the present invention may further contain (g) a thermal acid generator. The thermal acid generator (g) generates an acid on heating after development described later, so that it promotes a cross-linking reaction of the resin of component (a) with the thermal cross-linking agent of component (c) and also promotes the cyclization of the imide ring or the oxazole ring of the resin of component (a). This offers the improvement in chemical resistance of a cured film and successfully reduces film loss. The acid to be generated from the thermal acid generator (g) is preferably a strong acid and, for example, aryl sulfone acids, such as p-toluenesulfonic acid and benzenesulfonic acid, and alkyl sulfonic acids, such as methanesulfonic acid, ethanesulfonic acid, and butanesulfonic acid, are preferred. In the present invention, the thermal acid generator preferably is an aliphatic sulfonic acid compound represented by formula (4) or (5) and it may contain two or more kinds of such compounds.

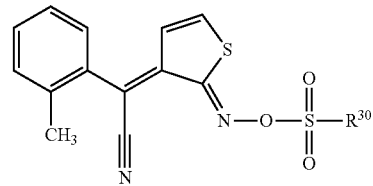

(4)

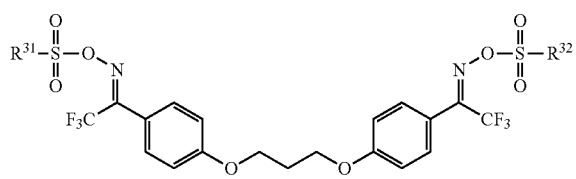

(5)

In the above formulae (4) and (5), $R^{30}$ to $R^{32}$ each represent an alkyl group having 1 to 10 carbon atoms or a monovalent aromatic group having 7 to 12 carbon atoms. The alkyl group and the aromatic group may be substituted and examples of a substituent include an alkyl group and a carbonyl group.

Specific examples of the compound represented by formula (4) include the following compounds.

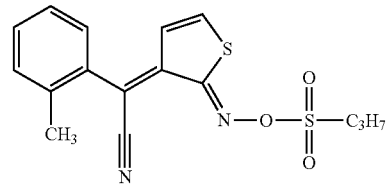

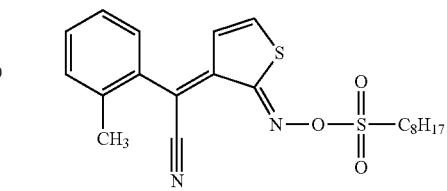

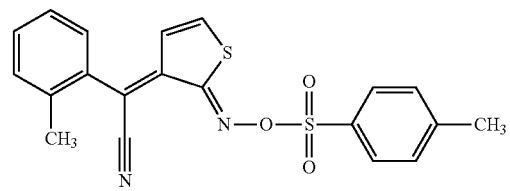

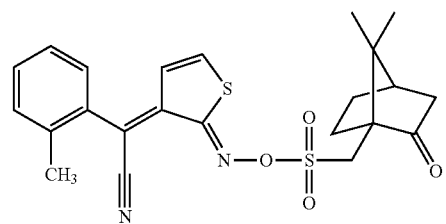

Specific examples of the compound represented by formula (5) include the following compounds.

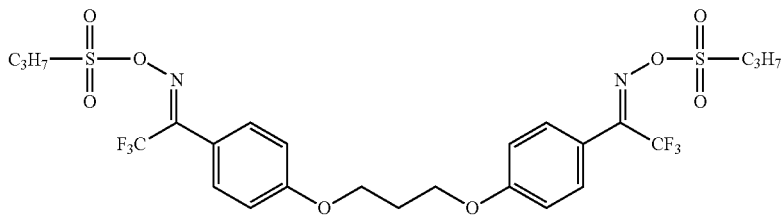

From the viewpoint of promoting a cross-linking reaction, the content of the thermal acid generator (g) is preferably 0.1 parts by weight or more, more preferably 0.3 parts by weight or more, and even more preferably 0.5 parts by weight or more relative to 100 parts by weight of the resin of component (a). On the other hand, from the viewpoint of the electrically insulating property of a cured film, it is preferably 20 parts by weight or less, more preferably 15 parts by weight or less, and even more preferably 10 parts by weight or less. When containing two or more kinds of component (g), their total amount is preferably within the above-mentioned range.

The resin composition of the present invention can contain (h) a filler. In the case of using the resin composition of the present invention as a solder resist for circuit boards, the inclusion of the filler (h) has an effect of exhibiting thixotropy to maintain a pattern at a prescribed size in the course of coating the composition by screen printing and drying it. Moreover, an effect to control shrinkage caused by heat curing is also expectable.

Among fillers (h), examples of insulative fillers include calcium carbonate, silica, alumina, aluminum nitride, titanium oxide, and silica-titaniumoxide composite particles, and silica, titanium oxide, and silica-titanium oxide composite particles are preferred. Examples of the electrically conductive filler include gold, silver, copper, nickel, aluminum, and carbon, and silver is preferred. Two or more of these may be contained depending upon the intended application. The content of the filler (h) is preferably within the range of 5 to 500 parts by weight relative to 100 parts by weight of component (a). The number average particle diameter of the filler (h) is preferably 10 µm or less and more preferably 2 µm or less. The use of two or more fillers differing in number average particle diameter in combination is also preferred from the viewpoint of imparting thixotropy and stress relaxation.

The use of particles having a number average particle diameter of 100 nm or less, which are so-called nanoparticles, as the filler (h) makes it possible to adjust physical properties such as index of refraction while maintaining light transmittance. Particularly, the use of nanoparticles with a high index of refraction makes it possible to develop a high transmittance and a high index of refraction simultaneously. The mixing of such nanoparticle makes it possible to be used suitably as a low-temperature-curable optical thin film, such as an on-chip microlens of a solid imaging element and a planarization film for displays and solid imaging elements. Examples of particles suitable for the above-mentioned purpose include tin oxide-aluminum oxide mixed particles, zirconium oxide-aluminum oxide mixed particles, zirconium oxide-silicon oxide mixed particles, tin oxide particles, zirconium oxide-tin oxide mixed particles, titanium oxide particles, tin oxide-titanium oxide mixed particles, silicon oxide-titanium oxide mixed particles, zirconium oxide-titanium oxide mixed particles, and zirconium oxide particles. The surface of particles may be coated with another substance. Although the above-mentioned particles may be either in the form of a powder or in the form of sol, they are preferably in the form of sol from the viewpoint of easiness with which they are dispersed. In view of transmittance, the number average particle diameter of the nanoparticles is preferably 50 nm or less and more preferably 30 nm or less.

The number average particle diameter of a filler can be measured by using various particle counters. The average particle diameter of nanoparticles can be measured by, for example, a gas adsorption method, a dynamic light scattering method, an X-ray small angle scattering method, or a method of measuring particle diameters directly with a transmission electron microscope. Although the particle diameter obtained by these measuring methods may be in volume average or in mass average, it can be converted into a number average molecular weight with the assumption that the shape of a particle is spherical.

The resin composition of the present invention can contain a thermally coloring compound that colors on heating to exhibit an absorbance maximum at 350 nm or longer and 700 nm or shorter or an organic pigment or dyestuff that has no absorbance maximum at 350 nm or longer and shorter than 500 nm and has an absorbance maximum at 500 nm or longer and 750 nm or shorter. The coloring temperature of the thermally coloring compound is preferably 120° C. or higher and more preferably is 150° C. or higher. The heat resistance under high temperature conditions becomes better and the light resistance becomes better without the occurrence of fading due to prolonged ultraviolet-visible light irradiation as the coloring temperature of the thermally coloring compound becomes higher.

Examples of the thermally coloring compound include heat-sensitive dyes, pressure-sensitive dyes, and hydroxyl group-containing compounds having a triarylmethane skeleton.

The resin composition of the present invention may contain an adhesion promoter. Examples of the adhesion promoter include silane coupling agents such as vinyltrimethoxysilane, vinyltriethoxysilane, epoxycyclohexylethyltrimethoxysilane, 3-glycidoxypropyltrimetoxysilane, 3-glycidoxypropyltriethoxysilane, p-styryl trimethoxysilane, 3-aminopropyl trimethoxysilane, 3-aminopropyltriethoxysilane, and N-phenyl-3-aminopropyltrimethoxysilane, titanium chelating agents, aluminum chelating agents, compounds to be obtained by reacting an aromatic amine compound with an alkoxy group-containing silicon compound. Two or more of these may be contained. Inclusion of such adhesive promoters can enhance the adhesion property with a base substrate, such as a silicon wafer, ITO, $SiO_2$, and silicon nitride, when, for example, developing a photosensitive resin film. Moreover, it is possible to enhance resistance to oxygen plasma and UV ozone treatment to be used for washing or the like. The content of the adhesion promoter is preferably 0.1 to 10 parts by weight per 100 parts by weight of the resin of component (a).

The resin composition of the present invention may contain an adhesion promoter. Examples of the adhesion promoter include alkoxysilane-containing aromatic amine compounds, aromatic amide compounds, and non-aromatic silane compounds. Two or more of these may be contained. Inclusion of such compounds can improve the adhesive property with a substrate after curing. Specific examples of the alkoxysilane-containing aromatic amine compounds and aromatic amide compounds are provided below. In addition, compounds obtainable by reacting an aromatic amine compound with an alkoxy group-containing silicon compound can also be used and examples thereof include compounds obtainable by reacting an aromatic amine compound with an alkoxysilane compound has a group that reacts with an amino group, such as an epoxy group and a chloromethyl group.

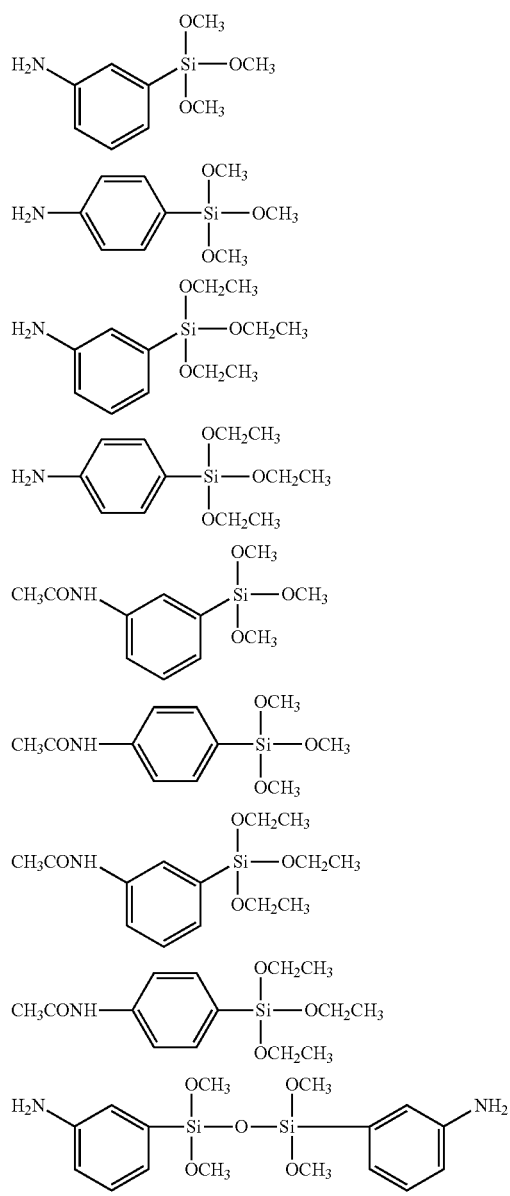

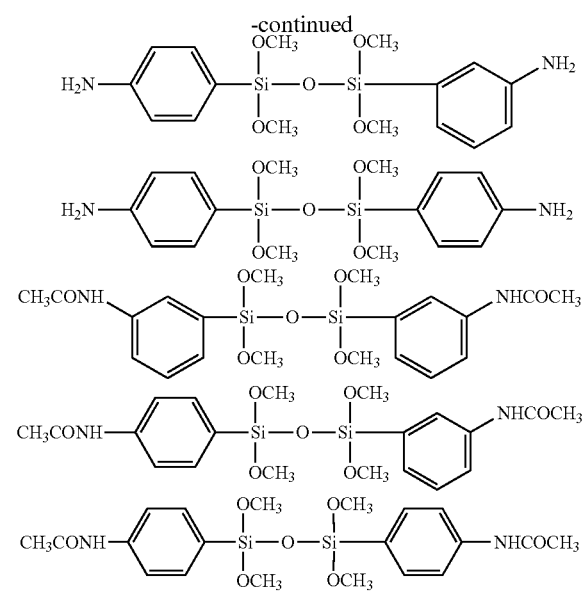

Examples of the non-aromatic silane compounds include vinyl silane compounds, such as vinyltrimethoxysilane, vinyltriethoxysilane, vinyl trichlorosilan, and vinyltris (β-methoxyethoxy) silane, and carbon-carbon unsaturated bond-containing silane compounds, such as 3-methacryloxypropyltrimethoxysilane, 3-acryloxyprophyltrimethoxysilane, p-styryltrimethoxysilane, 3-methacryloxypropylmethyldimethoxysilane, and 3-methacryloxypropyl methyldiethoxysilane. Among these, vinyltrimethoxysilane and vinyltriethoxysilane are preferred.

The total content of the alkoxysilane-containing aromatic amine compound, the aromatic amide compound, or the non-aromatic silane compound is preferably 0.01 to 15 parts by weight relative to 100 parts by weight of the resin of component (a).

The resin composition of the present invention may contain a surfactant, by which the wettability with a substrate can be improved.

Examples of the surfactant include fluorine-based surfactants, such as Fluorad (commercial name, available from Sumitomo 3M Ltd.), MEGAFAC (commercial name, available from DIC Corporation), and Sulfron (commercial name, available from Asahi Glass Co., Ltd.), organic siloxane surfactants, such as KP341 (commercial name, available from Shin-Etsu Chemical Co., Ltd.), DBE (commercial name, Chisso Corporation), POLYFLOW, GLANOL (commercial names, available from Kyoeisha Chemical Co., Ltd.) and BYK (available from BYK-Chemie), and acrylic polymer surfactants, such as POLYFLOW (commercial name, available from Kyoeisha Chemical Co., Ltd.).

The resin composition of the present invention preferably contains a solvent. Examples of the solvent include polar aprotic solvents, such as N-methyl-2-pyrrolidone, γ-butyrolactone, N,N-dimethylformamide, N,N-dimethylacetamide, and dimethyl sulfoxide, ethers, such as tetrahydrofuran, dioxane, propylene glycol monomethyl ether, and propylene glycol monoethyl ether, ketones, such as acetone, methyl ethyl ketone, diisobutyl ketone, and diacetone alcohol, esters, such as ethyl acetate, butyl acetate, isobutyl acetate, propyl acetate, propylene glycol monomethyl ether acetate, and 3-methyl-3-methoxy butyl acetate, alcohols, such as ethyl lactate, methyl lactate, diacetone alcohol, and 3-methyl-3-methoxybutanol, aromatic hydrocarbons, such as toluene and xylene. Two or more of these may be contained. The content of the solvent is preferably 100 to 2000 parts by weight relative to 100 parts by weight of the resin of component (a).

It is preferred for the resin composition of the present invention that the transmittance of a resin film before curing be high and the transmittance in the visible region of a cured film be low. Specifically, it is preferred that the change in transmittance at a wavelength of 450 nm before and after curing in a 3.0 μm thick film be 20% or more. Here, the transmittance at a wavelength of 450 nm is an index of the transmittance in the visible region. More specifically, it is preferred that the transmittance change be 20% or more, which is calculated by the following formula from the transmittance at a wavelength of 450 nm of a 3.0 μm thick film (before curing) to be obtained by coating a resin composition to a substrate and then heat-treating it at 120° C. for 2 minutes and the transmittance at a wavelength of 450 nm of a 3.0 μm thick film (after curing) to be obtained by further heat-treating the film before curing, at 230° C. for 30 minutes under nitrogen flow. The present invention makes it possible to realize such a change in transmittance easily.

Change in transmittance (%)=transmittance before curing (%)−transmittance after curing (%)

In the case of using the resin composition of the present invention as a photosensitive resin, it is preferred that the transmittance of a resin film before curing be high. Specifically, the transmittance at a wavelength of 450 nm of a resin film before curing is preferable 70% or more and more preferably 90% or more. It is preferred that the transmittance in the visible region of a cured film be low. Specifically, the transmittance at a wavelength of 450 nm of a cured film is preferable 70% or less and more preferably 60% or less. In the case of using the resin composition of the present invention for a planarization film or a dielectric film of a display device, it is possible to prevent malfunction caused by penetration of light to a TFT for driving, a leak electric current, or the like by adjusting the transmittance of a cured film to be low. For this reason, the change in transmittance at a wavelength of 450 nm before and after curing is preferably 20% to 100% and more preferably 30% to 100%.

Next, the method for producing the resin composition of the present invention is described. For example, a resin composition can be obtained by dissolving the aforementioned components (a) to (c) and, if necessary, components (d) to (h), a thermally coloring component, an adhesion promoter, an adhesion promoter, a surfactant, or the like in a solvent. Examples of the dissolving method include agitation and heating. In the case of heating, it is preferred to adjust the heating temperature as far as the performance of a resin composition is not impaired and it is usually from room temperature to 80° C. The order of dissolving components is not particularly limited and, for example, there is method of dissolving them one after another from a compound lower in solubility. As for a component that is prone to generate bubbles during dissolution by agitation, such as surfactants and some adhesion promoters, imperfect dissolution of other components due to the generation of bubbles can be prevented by dissolving the other components and lastly adding that component.

It is preferred to filter the resulting resin composition with a filter to remove dusts or particles. The hole diameter of the filter is, for example, but is not limited to, 0.5 μm, 0.2 μm, 0.1 μm, and 0.05 μm. Examples of the material of the filter include polypropylene (PP), polyethylene (PE), nylon (NY), and polytetrafluoroethylene (PTFE), and polyethylene and nylon are preferred. When the resin composition contains (h) a filler or an organic pigment, it is preferred to use a filter having a pore diameter larger than the particle diameter of them.

Next, the method for producing a cured film using the resin composition of the present invention is described. A resin composition film is obtained by coating the resin composition of the present invention by a spin coating method, a slit coating method, a dip coating method, a spray coating method, a printing method, or the like. In advance of coating, the substrate to which the resin composition is to be coated may be pretreated with the adhesion promoter mentioned above. For example, there is a method of treating a substrate surface by using a solution in which 0.5 to 20% by weight of an adhesion promoter has been dissolved in a solvent such as isopropanol, ethanol, methanol, water, tetrahydrofuran, propylene glycol monomethyl ether acetate, propylene glycol monomethyl ether, ethyl lactate, and diethyl adipate. Examples of the method of treating the substrate surface include spin coating, slit die coating, bar coating, dip coating, spray coating, and vapor treatment. According to need, it is permitted to advance a reaction between the substrate and the adhesion promoter by conducting drying treatment under reduced pressure and then conducting heat treatment of 50° C. to 300° C.

A cured film can be obtained by thermally treating a resulting resin composition film. For example, a method of performing heat treatment at 230° C. for 60 minutes, a method of performing heat treatment at 120 to 400° C. for 1 minute to 10 hours, a method of performing heat treatment at a low temperature of from room temperature to about 100° C. with addition of a curing catalyst or the like, and a method of performing curing at a low temperature of from room temperature to about 100° C. by a supersonic wave or electromagnetic wave treatment are mentioned.

When the resin composition of the present invention has photosensitivity, a negative type or positive type relief pattern can be obtained by irradiating the above-mentioned resin composition film partially with active light, such as an ultraviolet ray, and performing developing treatment with a developing solution.

A cured film obtained by curing the resin composition of the present invention is suitably used as a dielectric film or a protective film of wires. For example, there are an application for a dielectric film or a protective film of wires in a printed board in which wires are formed from copper, aluminum, or the like on a film or a substrate of a polyimide and ceramics, and an application for a protective film for partly soldering wires. When the resin composition contains an electrically conductive filler, it can also be used as a wire material.

Moreover, a cured film obtained by curing the resin composition of the present invention is suitably used as a planarization film or a dielectric layer of a display device having a substrate with a TFT formed thereon, a planarization film, a dielectric layer, and a display element in this order. Examples of a display device of this constitution include a liquid crystal display device and an organic EL display device. An active matrix type display device has a TFT on a substrate of glass or the like and wires located in a side portion of the TFT and connected to the TFT and has a planarization film thereon so that it may cover the irregularities of the wires, and it is further provided with a display element on the planarization film. The display element and the wires are connected via a contact hole formed in the planarization film. FIG. 1 shows a sectional view of a TFT substrate in which a planarization film and a dielectric layer have been formed. A bottom gate type or top gate type TFT 1 in matrix form has been provided on a substrate 6 and a dielectric film 3 has been formed with the TFT 1 covered therewith. A wire 2 connected to the TFT 1 has been provided under the dielectric film 3. Furthermore, on the dielectric film 3 have been provided a contact hole that opens the wire 2 and a planarization film 4 with the wire and the contact hole embedded. The planarization film 4 has been provided with an opening so as to reach the contact hole 7 of the wire 2. Moreover, an ITO (transparent electrode) 5 has been formed on the planarization film 4 in connection with the wire 2 via the contact hole 7. Here, the ITO 5 serves as an electrode of a display element (for example, organic EL element). In addition, a dielectric layer 8 is formed so that the periphery of the ITO 5 may be covered. This organic EL element may be either a top emission type which emits light from the side opposite to the substrate 6 or a bottom emission type which extracts light from the side of the substrate 6. In the above-described manner, an active matrix type organic EL display device in which the organic EL elements each have been connected to a TFT 1 for driving them.

Figure 2:
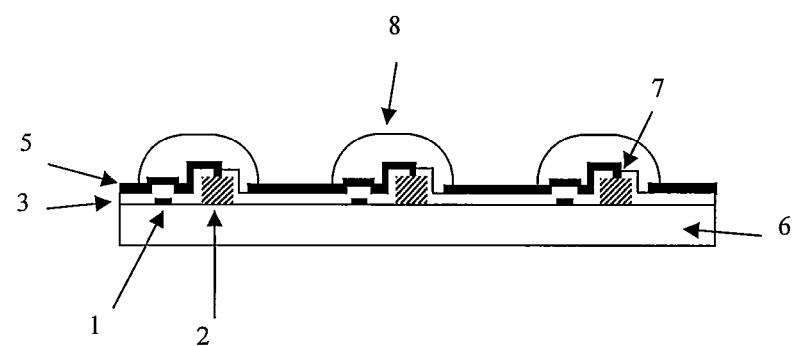
FIG. 2 is a sectional view of a TFT substrate in which a dielectric layer has been formed.

Moreover, a cured film obtained by curing the resin composition of the present invention is suitably used as a dielectric layer of a display device having a substrate with a TFT formed thereon, a dielectric layer, and a display element in this order. Examples of a display device having such a constitution include organic EL display devices. An active matrix type display device has a TFT on a substrate of glass or the like, and wires located in a side part of the TFT and connected to the TFT. The display element and the wires are connected via a contact hole formed in the dielectric film. FIG. 2 shows a sectional view of a TFT substrate in which a dielectric layer has been formed. A bottom gate type or top gate type TFT 1 in matrix form has been provided on a substrate 6 and a dielectric film 3 has been formed with the TFT 1 covered therewith. A wire 2 connected to the TFT 1 has been provided under the dielectric film 3. Moreover, a contact hole 7 has been formed on the dielectric film 3 so that it may open the wire 2. An ITO (transparent electrode) 5 has been formed in connection with the wire 2 via the contact hole 7. Here, the ITO 5 serves as an electrode of a display element (for example, organic EL element). A dielectric layer 8 is formed so that the periphery of the ITO 5, the TFT, and the steps of the wires may be covered. This organic EL element may be either a top emission type which emits light from the side opposite to the substrate 6 or a bottom emission type which extracts light from the side of the substrate 6. In the above-described manner, an active matrix type organic EL display device in which the organic EL elements each have been connected to a TFT 1 for driving them.

For example, in the case of an organic EL display device using a TFT comprising, for example, amorphous silicone, micro crystal silicon, or an oxide semiconductor typified by In—Ga—Zn—O, unfavorable phenomena, such as a leak electric current or a photoinduced electric current, may be caused due to penetration of blue light with a relatively high energy. Since a cured film obtainable from the resin composition of the present invention has a moderate absorption near 450 nm, the occurrence of a leak electric current, a photoinduced electric current, or the like is prevented and a stable driving/light emission characteristic is obtained by using for a dielectric layer, a planarization film, etc. in such an organic electroluminescence display device.

Moreover, a cured film to be obtained by curing the resin composition of the present invention can be used suitably for such applications as a surface protective film of a semiconductor element, such as LSI, an interlayer dielectric film, and an adhesive and an underfill agent for packing a device into a package, a capping agent that prevents copper migration, an on-chip microlens of a solid imaging element, and a planarization film for displays and solid imaging elements.

EXAMPLES

The present invention will be described below with reference to examples, but the invention is not limited by these examples. The evaluations of the resin compositions in examples were carried out by the following methods.

(1) Evaluation of Transmittance

A resin composition (hereinafter referred to as a varnish) was spin coated onto a 5 cm square glass substrate and was subjected to heat treatment (prebaking) at 120° C. for 2 minutes, so that a prebaked film having a thickness of 3.0 μm was produced. A varnish was spin coated so that its film thickness after curing might become 3.0 μm, and then heat treatment was carried out for 30 minutes at 230° C. under nitrogen flow (oxygen concentration 20 ppm or less) using an Inert Gas Oven INH-21CD available from Koyo Thermo Systems Co., Ltd., so that a cured film was produced. The thicknesses of the prebaked film and the cured film were measured using a SURFCOM 1400D (available from Tokyo Seimitsu Co., Ltd.). For each of the thus obtained prebaked film and cured film, a transmission spectrum at wavelengths of 300 nm to 700 nm was measured using a UV-VIS spectrophotometer Multi-Spec-1500 (available from Shimadzu Corporation) and a transmittance at a wavelength of 450 nm was measured. From a transmittance before curing (=prebaked film) and that after curing (=cured film), a change in transmittance was calculated using the following formula.

Change in transmittance (%)=transmittance before curing (%)−transmittance after curing (%)

When the change in transmittance is equal to or more than 20%, a judgment as being good can be provided and when it is equal to or more than 30%, a judgment as being very good can be provided.

(2) Evaluation of Sensitivity

The varnishes prepared in Examples 4 to 11 and Comparative Examples 5 to 6 were each rotation coated onto a 6-inch silicon wafer and then heat-treated for 3 minutes on a hot plate (Mark-7), so that 4.0 μm thick prebaked films were produced. The prebaking temperature was adjusted to 120° C. for Examples 4 to 9 and Comparative Examples 5 to 6 and 100° C. for Examples 10 to 11. The resulting prebaked films were exposed with an exposure of 0 to 500 mJ/cm$^2$ at a 25 mJ/cm$^2$ step using an i-line stepper (DSW-8000, available from GCA). The line & space patterns used for the exposure are 1, 2, 3, 4, 5, 6, 7, 8, 9, 10, 20, 30, 50 and 100 μm. In Examples 10 to 11, heating was carried out at 100° C. for 1 minute after the exposure. After the exposure for Examples 4-9 or after the exposure and the following heating for Examples 10 to 11, development was performed in a 2.38 wt % aqueous solution of tetramethylammonium (TMAH) (ELM-D, available from Mitsubishi Gas Chemical Co., Inc.) for 60 seconds, followed by rinsing with pure water, so that developed films were obtained. In the case of a positive type varnish, an exposure at which the exposed part was dissolved and disappeared through the development was defined as a photosensitivity. In the case of a negative type varnish, the thickness of a film after development was measured and an exposure at which 90% of the thickness of a prebaked film remained was defined as a photosensitivity. The thickness after prebaking and that after development were measured using a Lambda Ace STM-602 available from Dainippon Screen Mfg. Co., Ltd. at an index of refraction of 1.63.

(3) Evaluation of Chemical Resistance (i) The varnishes prepared in Examples 1 to 3 and Comparative Examples 1 to 4 were each spin coated out onto a 6 inch silicon wafer and then heat-treated for 3 minutes on a hot plate, so that 4.0 µm thick prebaked films were produced. On the other hand, films after development were produced from the varnishes prepared in Examples 4 to 11 and Comparative Examples 5 to 6 by the method described in the foregoing (2). The resulting prebaked films and film after development were heat-treated at 230° C. for 30 minutes under nitrogen flow (oxygen concentration 20 ppm or less) using an Inert Oven INH-21CD available Koyo Thermo Systems Co., Ltd., so that cured films were produced.

The resulting cured films were immersed in a stripping liquid 106 available from Tokyo Ohka Kogyo Co., Ltd. at 70° C. for 10 minutes. The thickness of a cured films before the stripping liquid treatment and the thickness of a cured film after that treatment were measured using a Lambda Ace STM-602 available from Dainippon Screen Mfg. Co., Ltd. at an index of refraction of 1.64, and then the reduction in film thickness was calculated. The reduction in film thickness is preferably 0.25 µm or less, more preferably 0.15 µm or less, and even more preferably 0.10 µm or less.

(ii) Cured films were produced by the method described in the foregoing (i) using the varnishes prepared in Examples 4 to 11 and Comparative Examples 5 to 6. The resulting cured films were immersed in a stripping liquid 106 available from Tokyo Ohka Kogyo Co., Ltd. at 70° C. for 10 minutes. A cured film after the stripping liquid treatment was observed with an optical microscope of 20 magnifications, so that the presence of coming off of a pattern was evaluated. The smallest pattern having no coming off of a pattern was defined as being a remaining pattern. Since the finer a pattern becomes, the more likely it comes off, when a remaining pattern is equal to or less than 20 µm, a judgment as being good can be provided and when it is equal to or less than 5 µm, a judgment as being very good can be provided.

Synthesis Example 1

Synthesis of a Hydroxyl Group-Containing Diamine Compound 18.3 g (0.05 mol) of 2,2-bis(3-amino-4-hydroxyphenyl)hexafluoropropane (BAHF, available from Central Glass Co., Ltd.) was dissolved in 100 mL of acetone and 17.4 g (0.3 mol) of propylene oxide (available from Tokyo Chemical Industry Co., Ltd.), followed by cooling to −15° C. A solution in which 20.4 g (0.11 mol) of 3-nitrobenzoyl chloride (available from Tokyo Chemical Industry Co. Ltd.) had been dissolved in 100 mL of acetone was dropped here. After the completion of the dropping, agitation was done at −15° C. for 4 hours and then the temperature was returned to room temperature. The precipitated white solid was collected by filtration and then was vacuum dried at 50° C.

30 g of the resulting white solid was placed in a 300 mL stainless steel autoclave and was dispersed in 250 mL of methyl cellosolve, followed by the addition of 2 g of 5% palladium-carbon (available from Wako Pure Chemical Industries, Ltd.). Hydrogen was introduced here with a balloon and a reduction reaction was performed at room temperature. About 2 hours later, the reaction was terminated on confirmation of the fact that the balloon no longer shrank. After the termination of the reaction, the palladium compound, the catalyst, was removed by filtration, followed by concentration with a rotary evaporator, affording a hydroxyl group-containing diamine compound represented by the following formula.

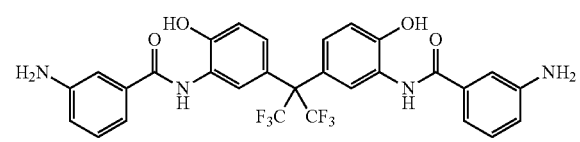 [SMILES: Nc1cccc(C(=O)Nc2cc(C(c3ccc(O)c(NC(=O)c4cccc(N)c4)c3)(C(F)(F)F)C(F)(F)F)ccc2O)c1]

Synthesis Example 2

Synthesis of a Quinone Diazide Compound

Under dry nitrogen flow, 21.22 g (0.05 mol) of TrisP-PA (commercial name, available from Honshu Chemical Industry Co., Ltd.) and 26.8 g (0.1 mol) of 5-naphthoquinonediazidosulfonyl chloride (NAC-5, available from Toyo Gosei Co., Ltd.) were dissolved in 450 g of 1,4-dioxane and the temperature was adjusted to room temperature. 12.65 g of triethylamine, which had been mixed with 50 g of 1,4-dioxane, was dropped here so that the temperature of the system might not become equal to or higher than 35° C. After the dropping, agitation was done at 40° C. for 2 hours. A triethylamine salt was filtered and the filtrate was poured into water. Then a precipitate formed was collected by filtration and washed with 1 L of 1% aqueous hydrochloric acid. Then it was further washed with 2 L of water twice. The precipitation was dried in a vacuum dryer, so that a quinone diazide compound represented by the following formula was obtained.

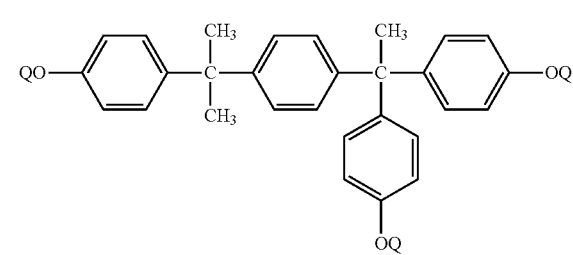

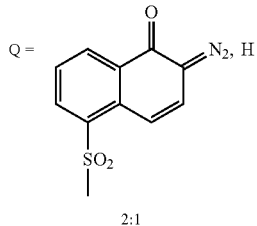

2:1

Synthesis Example 3

Synthesis of Alkoxymethyl Group-Containing Compound (A-1)

(1) 103.2 g (0.4 mol) of 1,1,1-tris(4-hydroxyphenyl)ethane (TrisP-HAP, available from Honshu Chemical Industry Co., Ltd.) was dissolved in a solution in which 80 g (2.0 mol) of sodium hydroxide had been dissolved in 800 g of pure water. After the complete dissolution, 686 g of 36-38 wt % formalin was dropped at 20 to 25° C. over 2 hours. Then agitation was done at 20 to 25° C. for 17 hours. This was neutralized by adding 98 g of sulfuric acid and 552 g of water and then was left at rest for 2 days. A needlelike white crystal formed after being left at rest was collected by filtration and then was washed with 100 mL of water. The white crystal was vacuum dried at 50° C. for 48 hours. When the dried white crystal was analyzed by a high-performance liquid chromatograph available from Shimadzu Corporation at 254 nm using ODS as a column, acetonitrile/water=70/30 as a developing solvent, it was found that the starting material had disappeared completely and the purity was 92%. Moreover, when analysis was done by NMR (GX-270, available from JEOL Ltd.) using DMSO-d6 as a deuterated solvent, it was found to be hexamethyloled TrisP-HAP.

(2) Next, the compound thus obtained was dissolved in 300 mL of methanol and was agitated at room temperature for 24 hours after the addition of 2 g of sulfuric acid. To this solution was added 15 g of an anionic ion exchange resin (Amberlyst IRA96SB, available from Rohm and Haas), followed by agitation for 1 hour. Then the ion exchange resin was removed by filtration. After that, 500 mL of ethyl lactate was added and methanol was removed by a rotary evaporator, so that an ethyl lactate solution was formed. This solution was left at rest at room temperature for 2 days, so that a white crystal generated. When the obtained white crystal was analyzed by high-performance liquid chromatography, it was found to be a hexamethoxymethyl compound of TrisP-HAP (alkoxymethyl group-containing compound (A-1)) represented by the following formula having a purity of 99%.

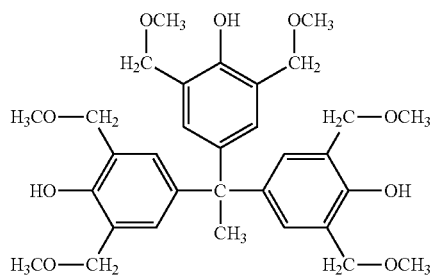 [SMILES: COCc1cc(C(C)(c2cc(COC)c(O)c(COC)c2)c2cc(COC)c(O)c(COC)c2)cc(COC)c1O]

Synthesis Example 4

Synthesis of Alkoxymethyl Group-Containing Compound (A-2)

(1) A dry white crystal was obtained in the same manner as in Synthesis Example 3(1) except for using 169.6 g (0.4 mol) of 4,4'-[1-[4-[1-(4-hydroxyphenyl-1)-1-methylethyl]phenyl]ethylidene]bisphenol (TrisP-PA, available from Honshu Chemical Industry Co., Ltd.) instead of 103.2 g (0.4 mol) of 1,1,1-tris(4-hydroxyphenyl)ethane (TrisP-HAP, available from Honshu Chemical Industry Co., Ltd.). This was analyzed by high-performance liquid chromatography in the same manner as in Synthesis Example 3 (1) to be found that the starting materials had disappeared completely and the purity was 88%. Moreover, it was subjected to NMR analysis in the same manner as in Synthesis Example 3 (1), thereby being found to be hexamethyloled TrisP-PA.

(2) Next, a white crystal was obtained in the same manner as in Synthesis Example 3(2) except for using hexamethyloled TrisP-PA obtained by the described method instead of the hexamethyloled TrisP-HAP. The obtained white crystal was analyzed by high-performance liquid chromatography to be a hexamethoxymethyl compound of TrisP-PA (alkoxymethyl group-containing compound (A-2)) represented by a following formula having a purity of 99%.

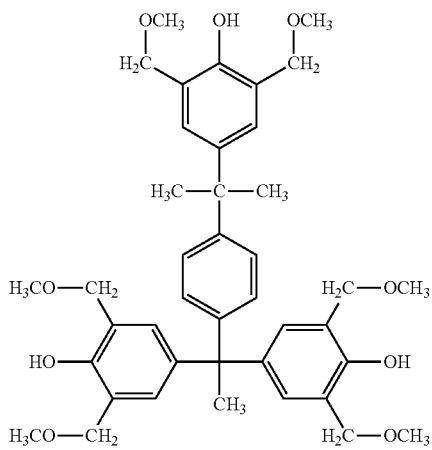 [SMILES: COCc1cc(C(C)(C)c2ccc(C(C)(c3cc(COC)c(O)c(COC)c3)c3cc(COC)c(O)c(COC)c3)cc2)cc(COC)c1O]

Synthesis Example 5

Synthesis of Alkoxymethyl Group-Containing Compound (A-3)

(1) Hexamethyloled TrisP-HAP having a purity of 92% was obtained in the same manner as in Synthesis Example 3(1).

(2) Next, a white crystal was obtained in the same manner as in Synthesis Example 3 (2) except for using 300 mL of ethanol instead of 300 mL of methanol. The obtained white crystal was analyzed by high-performance liquid chromatography to be a ethoxymethyl compound of TrisP-HAP (alkoxymethyl group-containing compound (A-3)) represented by a following formula having a purity of 98%.

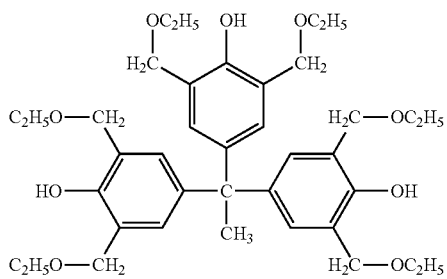

Synthesis Example 6

Synthesis of Adhesion Promoter (B-1)

36.6 g (0.1 mol) of BAHF (available from Central Glass Co., Ltd.) was dissolved in 100 g of ethyl lactate (EL, available from Musashino Chemical Laboratory, Ltd.). Subsequently, 55.6 g (0.2 mol) of 3-glycidoxypropyltriethoxysilane (KBE-403, available from Shin-Etsu Chemical Co., Ltd.) was added to this solution and agitated at 50° C. for 6 hours, so that adhesion promoter (B-1) was obtained.

Other thermal cross-linking agents and acid generators used in the Examples and the Comparative Examples are as follows.

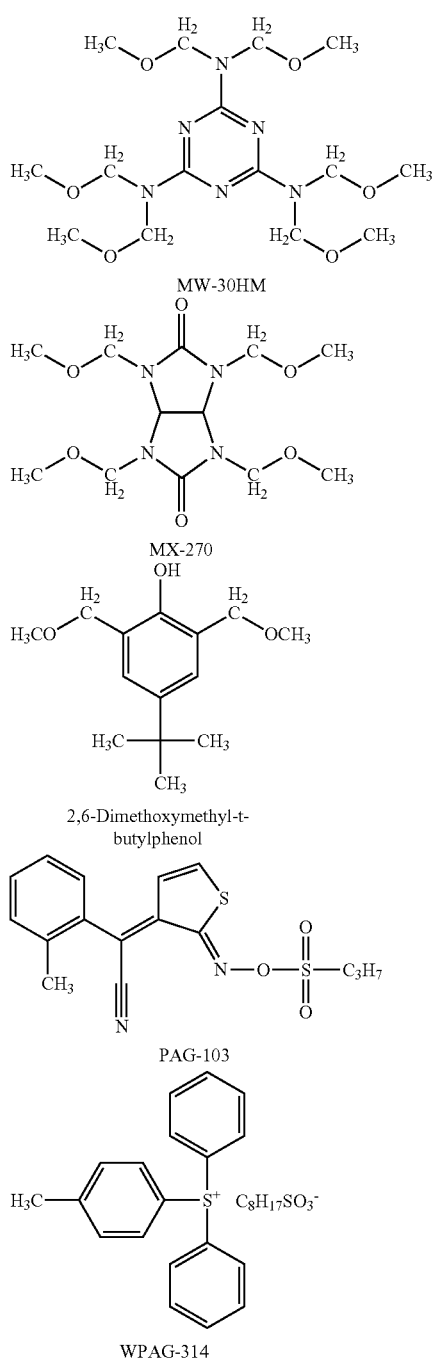

MW-30HM

MX-270

2,6-Dimethoxymethyl-t-butylphenol

PAG-103

WPAG-314

Example 1

32.9 g (0.09 mol) of BAHF was dissolved in 500 g of N-methyl pyrrolidone (NMP) under dry nitrogen flow. Here was added 31.0 g (0.1 mol) of 3,3',4,4'-diphenyl ether tetracarboxylic dianhydride (ODPA, available from Manac Incorporated) together with 50 g of NMP, followed by agitation at 30° C. for 2 hours. Then 2.18 g (0.02 mol) of 3-aminophenol (available from Tokyo Chemical Industry Co. Ltd.) was added and agitation was continued at 40° C. for 2 hours. In addition, 5 g of pyridine (available from Tokyo Chemical Industry Co. Ltd.) was diluted in toluene (30 g, available from Tokyo Chemical Industry Co. Ltd.) and was added to the solution, and then a cooling tube was attached and a reaction was carried out for 2 hours with the temperature of the solution kept at 120° C. and further for 2 hours at 180° C. while azeotropically removing water together with toluene out of the system. The temperature of this solution was dropped to room temperature and the solution was poured into 3 L of water, so that a white powder was obtained. This powder was collected by filtration and further was washed with water three times. After the washing, the white powder was dried in a vacuum dryer of 50° C. for 72 hours, so that a polyimide was obtained.

To 10 g of the polyimide were added 4 g of 1,5-dihydroxynaphthalene (available from Tokyo Chemical Industry Co. Ltd.), 5 g of the alkoxymethyl group-containing compounds (A-1) obtained in Synthesis Example 3, and 40 g of gamma-butyrolactone (GBL, available from Mitsubishi Chemical Corporation), so that a varnish of a polyimide resin composition was obtained. As to the transmittance at 450 nm of a film obtained using this varnish measured before or after curing, the transmittance before curing was 95% and that after curing was 61%. This means that the change in transmittance was 34%. When the chemical resistance of the cured film was evaluated, the reduction in film thickness was 0.10 μm or less and therefore the chemical resistance was very good.

Comparative Example 1

A varnish of a polyimide resin composition was obtained in the same manner as in Example 1 except for adding 5 g of 2,6-dimethoxymethyl-t-butylphenol (available from Honshu Chemical Industry Co., Ltd.) instead of the alkoxymethyl group-containing compound (A-1) obtained in Synthesis Example 3. As to the transmittance at 450 nm of a film obtained using this varnish measured before or after curing, the transmittance before curing was 96% and that after curing was 85%. This means that the change in transmittance was 11%. When the chemical resistance of the cured film was evaluated, the film dissolved completely.

Comparative Example 2

Into a 500-ml flask were charged 5 g of 2,2'-azobis (isobutyronitrile) and 200 g of tetrahydrofuran (THF). Then 35 g of methyl methacrylate (MM), 30 g of tert-butyl methacrylates (t-BM), and 35 g of methacrylic acid (MA) were charged and agitated at room temperature for a while, and after replacing the inside of the flask with nitrogen, agitation was done at room temperature for 40 hours. 300 g of propylene glycol monomethyl ether was added here and was agitated. After the completion of the agitation, the solution was charged into 2 L of water and a precipitate of a polymer solid was collected by filtration. Furthermore, washing with 2 L of water was done three times and the collected polymer solid was dried at 50° C. in a vacuum dryer for 72 hours, so that an acrylic resin was obtained.

To 10 g of the obtained acrylic resin were added 4 g of 1,5-dihydroxynaphthalene (available from Tokyo Chemical Industry Co. Ltd.), 5 g of the alkoxymethyl group-containing compound (A-1) obtained in Synthesis Example 3, and 40 g of propylene glycol monomethyl ether acetate (PMA, available from Kuraray Co., Ltd.), so that a varnish of an acrylic resin composition was obtained. As to the transmittance at 450 nm of a film obtained using this varnish measured before or after curing, the transmittance before curing was 97% and that after curing was 93%. This means that the change in transmittance was 4%. When the chemical resistance of the cured film was evaluated, the film dissolved completely.

Example 2

57.4 g (0.095 mol) of the hydroxyl group-containing diamine obtained in Synthesis Example 1 and 1.24 g (0.005 mol) of 1,3-bis(3-aminopropyl)tetramethyldisiloxane (SiDA) were dissolved in 200 g of NMP under dry nitrogen flow. 31.0 g (0.1 mol) of ODPA was added here and agitated at 40° C. for 2 hours. Then a solution in which 7.14 g (0.06 mol) of demethyl foramide dimethyl acetal (available from Mitsubishi Rayon Co., Ltd., DFA) had been diluted with 5 g of NMP was dropped over 10 minutes. After the dropping, agitation was continued at 40° C. for 2 hours. After the completion of the agitation, the solution was charged into 2 L of water and a precipitate of a polymer solid was collected by filtration. Furthermore, washing with 2 L of water was done three times and the collected polymer solid was dried at 50° C. in a vacuum dryer for 72 hours, so that a polyamide acid was obtained.

Figure 3:
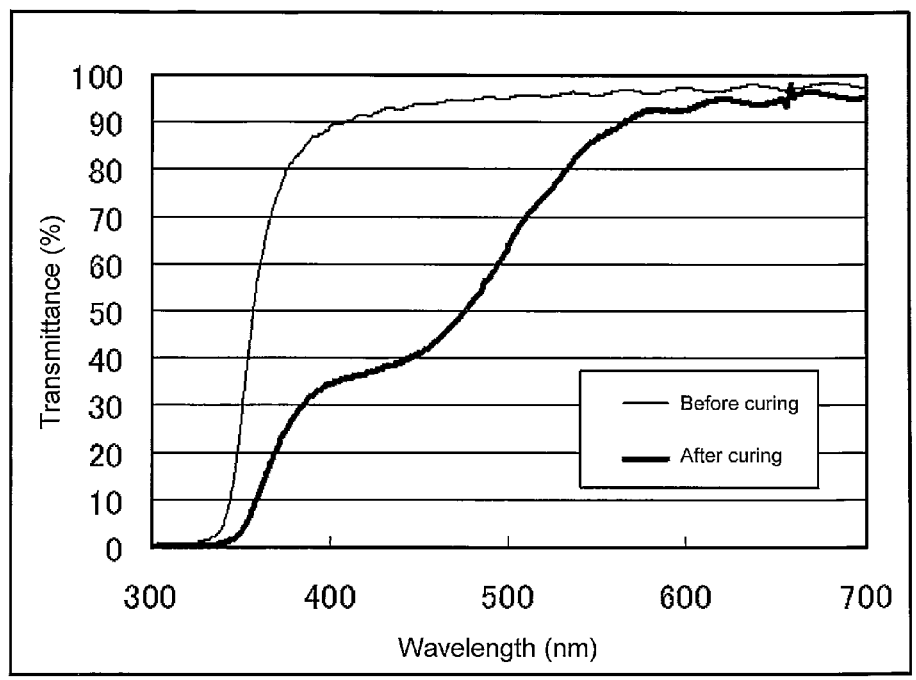
FIG. 3 is a transmission spectra of the resin composition of Example 2 before and after curing.

A varnish of a polyimide precursor composition was obtained by weighing 10 g of the thus obtained polyamide acid and dissolving 2 g of 1,6-dihydroxynaphthalene (available from Tokyo Chemical Industry Co. Ltd.) and 4 g of MW-30HM (available from Sanwa Chemical Co., Ltd.) in 20 g of EL and 20 g of GBL. As to the transmittance at 450 nm of a film obtained using this varnish measured before or after curing, the transmittance before curing was 94% and that after curing was 40%. This means that the change in transmittance was 54%. The transmission spectra before and after curing are shown in FIG. 3. The transmittance of 400 nm to 550 nm dropped due to curing and therefore it was shown that coloring occurred clearly in the visible range. When the chemical resistance of the cured film was evaluated, the reduction in film thickness was 0.10 µm or less and therefore the chemical resistance was very good.

Example 3

A varnish of a polyimide resin composition was prepared in the same manner as in Example 2 except for adding 10 g of the polyimide powder obtained in Example 1 instead of the polyamide acid and it was evaluated. It was found that as to the transmittance at 450 nm of a film measured before or after curing, the transmittance before curing was 95% and that after curing was 45%. This means that the change in transmittance was 50%. When the chemical resistance of the cured film was evaluated, the reduction in film thickness was 0.1 µm or less and therefore the chemical resistance was very good.

Comparative Example 3

Figure 4:
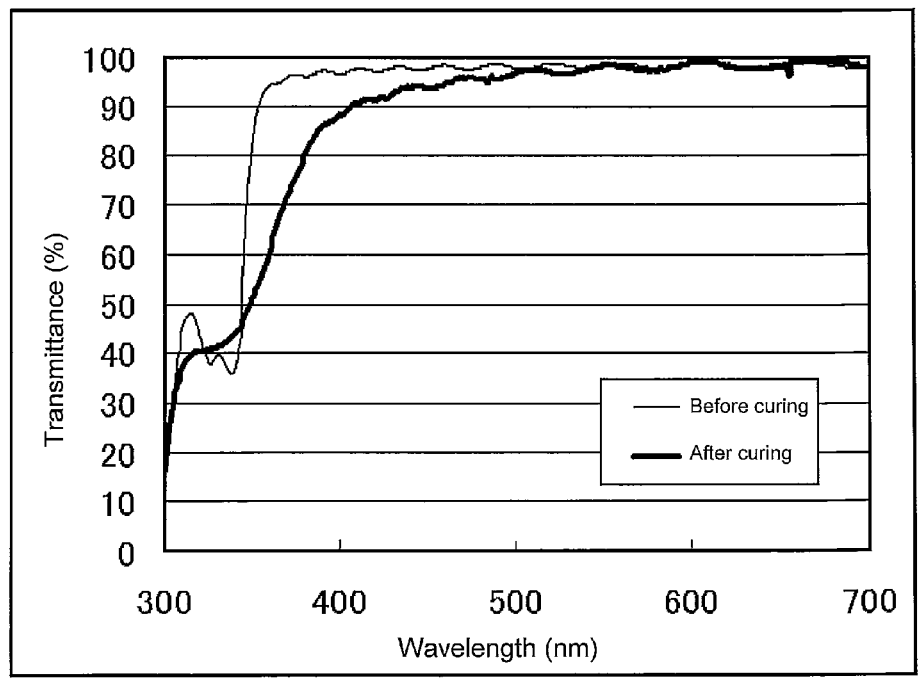
FIG. 4 is a transmission spectra of the resin composition of Comparative Example 3 before and after curing.

A varnish of a novolac resin composition was prepared in the same manner as in Example 2 except for using 10 g of a novolac resin PSF2808 (available from Gun Ei Chemical Industry Co, Ltd.) instead of the polyamide acid and it was evaluated. It was found that as to the transmittance at 450 nm of a film measured before or after curing, the transmittance before curing was 97% and that after curing was 88%. This means that the change in transmittance was 9%. The transmission spectra before and after curing are shown in FIG. 4. The transmittance hardly dropped in the region of 400 nm or more after curing and therefore it was shown that coloring did not occurred in the visible range. When the chemical resistance of the cured film was evaluated, the film dissolved completely.

Comparative Example 4

A varnish of a polyhydroxystyrene resin composition was prepared in the same manner as in Example 2 except for using 10 g of a polyhydroxystyrene resin MARUKA LYNCUR S-2 (available from Maruzen Petrochemical Co., Ltd.) instead of the polyamide acid and it was evaluated. It was found that as to the transmittance at 450 nm of a film measured before or after curing, the transmittance before curing was 97% and that after curing was 91%. This means that the change in transmittance was 6%. When the chemical resistance of the cured film was evaluated, the film dissolved completely.

Example 4

A varnish of a positive type photosensitive polyimide resin composition was obtained by further dissolving 4 g of the quinone diazide compound obtained in Synthesis Example 2 in the varnish of Example 1. Using the obtained varnish, the evaluation of the transmittance, the evaluation of the chemical resistance and the evaluation of the photosensitivity of a film before and after curing were performed as mentioned above. The transmittance at 450 nm was 95% before curing and 60% after curing. This means that the change in transmittance was 35%. The photosensitivity was 150 mJ/cm². The reduction in film thickness was 0.10 µm or less. A pattern of 10 µm or more remained.

Example 5

A varnish of a positive type photosensitive polyimide precursor composition was obtained by weighing 10 g of the polyamide acid obtained in Example 2 and dissolving 4 g of 1,7-dihydroxynaphthalene (available from Tokyo Chemical Industry Co. Ltd.), 5 g of the alkoxymethyl group-containing compound (A-2) obtained in Synthesis Example 4, and 4 g of the quinonediazide compound obtained in Synthesis Example 2 in 20 g of EL and 20 g of GBL. Using the obtained varnish, the evaluation of the transmittance, the evaluation of the chemical resistance and the evaluation of the photosensitivity of a film before and after curing were performed as mentioned above. The transmittance at 450 nm was 90% before curing and 59% after curing. This means that the change in transmittance was 31%. The photosensitivity was 150 mJ/cm². The reduction in film thickness was 0.15 µm. A pattern of 10 µm or more remained.

Comparative Example 5

A varnish of a positive type photosensitive polyimide precursor composition was prepared in the same manner as in Example 5 except for using 1-naphthol instead of 1,7-dihydroxynaphthalene and it was evaluated. The transmittance at 450 nm was 90% before curing and 77% after curing. This means that the change in transmittance was 13%. The reduction in film thickness was 0.20 µm. The photosensitivity was 300 mJ/cm². A pattern of 20 µm or more remained.

Comparative Example 6

A varnish of a positive type photosensitive polyimide precursor composition was prepared in the same manner as in Example 5 except for using 2,7-dihydroxynaphthalene instead of 1,7-dihydroxynaphthalene and it was evaluated. The transmittance at 450 nm was 90% before curing and 74% after curing. This means that the change in transmittance was 16%. The reduction in film thickness was 0.15 μm. The photosensitivity was 150 mJ/cm². A pattern of 10 μm or more remained.

Example 6

A varnish of a positive type photosensitive polyimide precursor composition was prepared by further dissolving, in the varnish of Example 5, 0.5 g of 5-propylsulfonyloxyimino-5H-thiophene-2-methylphenyl-acetonitrile (commercial name PAG-103, available from Ciba Specialty Chemicals Corporation) as a thermal acid generator. Using the obtained varnish, the evaluation of the transmittance, the evaluation of the chemical resistance and the evaluation of the photosensitivity of a film before and after curing were performed as mentioned above. The transmittance at 450 nm was 90% before curing and 59% after curing. This means that the decrease in transmittance was 31%. The photosensitivity was 150 mJ/cm². The reduction in film thickness was 0.10 μm or less. A pattern of 10 μm or more remained.

Example 7

A varnish of a positive type photosensitive polyimide precursor composition was obtained by further dissolving, in the varnish of Example 5, 0.5 g of the adhesion promoter (B-1) obtained in Synthesis Example 6. Using the obtained varnish, the evaluation of the transmittance, the evaluation of the chemical resistance and the evaluation of the photosensitivity of a film before and after curing were performed as mentioned above. The transmittance at 450 nm was 90% before curing and 59% after curing. This means that the change in transmittance was 31%. The photosensitivity was 150 mJ/cm². The reduction in film thickness was 0.15 μm. A pattern of 3 μm or more remained.

Example 8

A varnish of a positive type photosensitive polyimide precursor composition was obtained by weighing 10 g of the polyamide acid obtained in Example 2 and dissolving 4 g of 2,3-dihydroxynaphthalene (available from Tokyo Chemical Industry Co. Ltd.), 5 g of the alkoxymethyl group-containing compound (A-2) obtained in Synthesis Example 4, and 4 g of the quinonediazide compound obtained in Synthesis Example 2 in 20 g of EL and 20 g of GBL. Using the obtained varnish, the evaluation of the transmittance, the evaluation of the chemical resistance and the evaluation of the photosensitivity of a film before and after curing were performed as mentioned above. The transmittance at 450 nm was 93% before curing and 63% after curing. This means that the change in transmittance was 30%. The reduction in film thickness was 0.15 μm. The photosensitivity was 200 mJ/cm². A pattern of 10 μm or more remained.

Example 9

18.3 g (0.05 mol) of BAHF was dissolved in 50 g of NMP and 26.4 g (0.3 mol) of glycidyl methyl ether under dry nitrogen flow and the temperature of the solution was cooled to −15° C. Here was dropped a solution in which 7.4 g (0.025 mol) of diphenyl ether dicarboxylic acid dichloride (available from Nihon Nohyaku Co., Ltd.) and 5.1 g (0.025 mol) of isophthalic acid chloride (available from Tokyo Chemical Industry Co. Ltd.) had been dissolved in 25 g of GBL so that the internal temperature might not exceed 0° C. After the completion of the dropping, agitation was continued at −15° C. for 6 hours. After the completion of the reaction, the solution was charged into 3 L of water containing 10% by weight of methanol and a white precipitate was collected. This precipitate was collected by filtration, washed with water three times, and then dried in a vacuum dryer of 50° C. for 72 hours, so that a polyhydroxyamide was obtained.

A varnish of a positive type photosensitive polybenzoxazole precursor composition was obtained by dissolving 10 g of the obtained polyhydroxyamide, 4 g of 1,5-dihydroxynaphthalene, 2 g of the quinone diazide compound of Synthesis Example 2, 0.5 g of WPAG-314 (commercial name, available from Wako Pure Chemical Industries, Ltd.), and 5 g of MX-270 in 10 g of EL and 30 g of GBL. Using the obtained varnish, the evaluation of the transmittance, the evaluation of the chemical resistance and the evaluation of the photosensitivity of a film before and after curing were performed as mentioned above. The transmittance at 450 nm was 92% before curing and 61% after curing. This means that the decrease in transmittance was 31%. The reduction in film thickness was 0.25 μm and the photosensitivity was 160 mJ/cm². A pattern of 20 μm or more remained.

Example 10

A varnish of a negative type photosensitive polybenzoxazole precursor composition was obtained by dissolving 10 g of the polyhydroxyamide obtained in Example 9, 1.5 g of 1,7-dihydroxynaphthalene, 0.5 g of WPAG-314 (commercial name, available from Wako Pure Chemical Industries, Ltd.), 0.5 g of 5-propylsulfonyloxyimino-5H-thiophene-2-methylphenyl-acetonitrile (commercial name PAG-103, available from Ciba Specialty Chemicals Corporation) as a thermal acid generator, and 2 g of MW-30HM in 40 g of GBL. Using the obtained varnish, the evaluation of the transmittance, the evaluation of the chemical resistance and the evaluation of the photosensitivity of a film before and after curing were performed as mentioned above. The transmittance at 450 nm was 95% before curing and 57% after curing. This means that the change in transmittance was 38%. The reduction in film thickness was 0.25 μm and the photosensitivity was 200 mJ/cm². A pattern of 20 μm or more remained.

Example 11

A varnish of a negative type photosensitive polyimide resin composition was obtained by adding 5 g of 1,7-dihydroxynaphthalene, 4 g of the alkoxymethyl group-containing compounds (A-3) obtained in Synthesis Example 5, 2 g of ethyleneoxide-modified bisphenol A dimethacrylate (NK ester BPE-100, available from Shin-Nakamura Chemical Co., Ltd.), 0.5 g of trimethylolpropane triacrylate, 0.1 g of 1,2-octanedione-1-[4-(phenylthio)-2-(O-benzoyloxime)] (available from Ciba Specialty Chemicals Corporation), 20 g of EL, and 20 g of GBL to 10 g of the polyimide obtained in Example 1. Using the obtained varnish, the evaluation of the transmittance, the evaluation of the chemical resistance and the evaluation of the photosensitivity of a film before and after curing were performed as mentioned above. The transmittance at 450 nm was 94% before curing and 66% after curing. This means that the change in transmittance was 28%. The reduction in film thickness was 0.1 μm and the photosensitivity was 200 mJ/cm². A pattern of 10 μm or more remained.

The compositions and evaluation results of Examples 1 to 11 and Comparative Examples 1 to 6 are shown in Tables 1 to 3.

TABLE 1

| | Resin composition component | | | |
|---|---|---|---|---|
| | Resin (Added amount) | Fused polycyclic aromatic compound having a hydroxyl group (Added amount) | Thermal cross-linking agent (Added amount) | Photo acid generator (Added amount) |
| Example 1 | Polyimide (10 g) | 1,5-Dihydroxynaphthalene (4 g) | A-1 (5 g) | — |
| Example 2 | Polyamide acid (10 g) | 1,6-Dihydroxynaphthalene (2 g) | MW-30HM (4 g) | — |
| Example 3 | Polyimide (10 g) | 1,6-Dihydroxynaphthalene (2 g) | MW-30HM (4 g) | — |
| Example 4 | Polyimide (10 g) | 1,5-Dihydroxynaphthalene (4 g) | A-1 (5 g) | Synthesis Example 2 (4 g) |
| Example 5 | Polyamide acid (10 g) | 1,7-Dihydroxynaphthalene (4 g) | A-2 (5 g) | Synthesis Example 2 (4 g) |
| Example 6 | Polyamide acid (10 g) | 1,7-Dihydroxynaphthalene (4 g) | A-2 (5 g) | Synthesis Example 2 (4 g) |
| Example 7 | Polyamide acid (10 g) | 1,7-Dihydroxynaphthalene (4 g) | A-2 (5 g) | Synthesis Example 2 (4 g) |
| Example 8 | Polyamide acid (10 g) | 2,3-Dihydroxynaphthalene (4 g) | A-2 (5 g) | Synthesis Example 2 (4 g) |
| Example 9 | Polyhydroxyamide (10 g) | 1,5-Dihydroxynaphthalene (4 g) | MX-270 (5 g) | Synthesis Example 2 (2 g) WPAG-314 (0.5 g) |

| | Resin composition component | | | |
|---|---|---|---|---|
| | Photopolymerization initiator (Added amount) | Compound having two or more ethylenically unsaturated bonds (Added amount) | Others | Solvent |
| Example 1 | — | — | — | GBL (40 g) |
| Example 2 | — | — | — | EL/GBL (20 g/20 g) |
| Example 3 | — | — | — | EL/GBL (20 g/20 g) |
| Example 4 | — | — | — | GBL (40 g) |
| Example 5 | — | — | — | EL/GBL (20 g/20 g) |
| Example 6 | — | — | PAG-103 (0.5 g) | EL/GBL (20 g/20 g) |
| Example 7 | — | — | Adhesion promoter B-1 (0.5 g) | EL/GBL (20 g/20 g) |
| Example 8 | — | — | — | EL/GBL (20 g/20 g) |
| Example 9 | — | — | — | EL/GBL (10 g/30 g) |

TABLE 2

| | Resin composition component | | | |
|---|---|---|---|---|
| | Resin (Added amount) | Fused polycyclic aromatic compound having a hydroxyl group (Added amount) | Thermal cross-linking agent (Added amount) | Photo acid generator (Added amount) |
| Example 10 | Polyhydroxyamide (10 g) | 1,7-Dihydroxynaphthalene (1.5 g) | MW-30HM (2 g) | WPAG-314 (0.5 g) |

TABLE 2-continued

| | | | | |
|---|---|---|---|---|
| Example 11 | Polyimide (10 g) | 1,7-Dihydroxynaphthalene (5 g) | A-3 (4 g) | — |
| Comparative Example 1 | Polyimide (10 g) | 1,5-Dihydroxynaphthalene (4 g) | 2,6-Dimethoxymethyl-t-butylphenol(5 g) | — |
| Comparative Example 2 | Acrylic resin (10 g) | 1,5-Dihydroxynaphthalene (4 g) | A-1 (5 g) | — |
| Comparative Example 3 | Novolak resin (10 g) | 1,6-Dihydroxynaphthalene (2 g) | MW-30HM (4 g) | — |
| Comparative Example 4 | Polyhydroxystyrene (10 g) | 1,6-Dihydroxynaphthalene (2 g) | MW-30HM (4 g) | — |
| Comparative Example 5 | Polyamide acid (10 g) | 1-Naphthol (4 g) | A-2 (5 g) | Synthesis Example 2 (4 g) |
| Comparative Example 6 | Polyamide acid (10 g) | 2,7-Dihydroxynaphthalene (5 g) | A-2 (5 g) | Synthesis Example 2 (4 g) |

| | Resin composition component | | | |
|---|---|---|---|---|
| | Photopolymerization initiator (Added amount) | Compound having two or more ethylenically unsaturated bonds(Added amount) | Others | Solvent |
| Example 10 | — | — | PAG-103 (0.5 g) | GBL (40 g) |
| Example 11 | 1,2-Octanedione-1-[4-(phenylthio)phenyl]-2-(o-benzoyloxime) (0.1 g) | Ethoxylated bisphenol A dimethacrylate (2 g) Trimethylolpropane triacrylate (0.5 g) | — | EL/GBL (20 g/20 g) |
| Comparative Example 1 | — | — | | GBL (40 g) |
| Comparative Example 2 | — | — | | PMA (40 g) |
| Comparative Example 3 | — | — | | EL/GBL (20 g/20 g) |
| Comparative Example 4 | — | — | | EL/GBL (20 g/20 g) |
| Comparative Example 5 | — | — | | EL/GBL (20 g/20 g) |
| Comparative Example 6 | — | — | | EL/GBL (20 g/20 g) |

TABLE 3

| | Transmittance | | | | Chemical resistance | |
|---|---|---|---|---|---|---|
| | Transmittance at 450 nm before curing | Transmittance at 450 nm after curing | Change in transmittance at 450 nm | Photosensitivity | Loss of film | Remaining pattern |
| Example 1 | 95% | 61% | 34% | — | ≤0.10 μm | — |
| Example 2 | 94% | 40% | 54% | — | ≤0.10 μm | — |
| Example 3 | 95% | 45% | 50% | — | ≤0.10 μm | — |
| Example 4 | 95% | 60% | 35% | 150 mJ/cm2 | ≤0.10 μm | 10 μm |
| Example 5 | 90% | 59% | 31% | 150 mJ/cm2 | 0.15 μm | 10 μm |
| Example 6 | 90% | 59% | 31% | 150 mJ/cm2 | ≤0.10 μm | 10 μm |
| Example 7 | 90% | 59% | 31% | 150 mJ/cm2 | 0.15 μm | 3 μm |
| Example 8 | 93% | 63% | 30% | 200 mJ/cm2 | 0.15 μm | 10 μm |
| Example 9 | 92% | 61% | 31% | 160 mJ/cm2 | 0.25 μm | 20 μm |
| Example 10 | 95% | 57% | 38% | 200 mJ/cm2 | 0.25 μm | 20 μm |
| Example 11 | 94% | 66% | 28% | 200 mJ/cm2 | 0.10 μm | 10 μm |
| Comparative Example 1 | 96% | 85% | 11% | — | Completely dissolved | — |
| Comparative Example 2 | 97% | 93% | 4% | — | Completely dissolved | — |
| Comparative Example 3 | 97% | 88% | 9% | — | Completely dissolved | — |
| Comparative Example 4 | 97% | 91% | 6% | — | Completely dissolved | — |
| Comparative | 90% | 77% | 13% | 300 mJ/cm2 | 0.20 μm | 20 μm |

TABLE 3-continued

|  | Transmittance | | | | Chemical resistance | |
| --- | --- | --- | --- | --- | --- | --- |
|  | Transmittance at 450 nm before curing | Transmittance at 450 nm after curing | Change in transmittance at 450 nm | Photosensitivity | Loss of film | Remaining pattern |
| Example 5 Comparative Example 6 | 90% | 74% | 16% | 150 mJ/cm2 | 0.15 μm | 10 μm |

Example 12

A bottom gate type TFT was formed on a glass substrate and wiring (1.0 μm in height) connected to the TFT was formed. A dielectric film made of $Si_3N_4$ was formed so that the TFT and the wires might be covered therewith. Next, a contact hole was formed in this dielectric film.

Moreover, a planarization film was formed on the dielectric film in order to planarize the irregularities of the TFT and the wires. The formation of the planarization film on the dielectric film was carried out by spin coating the varnish of the photosensitive polyimide precursor composition obtained in Example 5 onto the substrate, prebaking it on a hot plate at 120° C. for 3 minutes, then exposing and developing it, and then subjecting it to heat calcination at 250° C. for 60 minutes under air flow. The coating property at the time of coating the varnish was good and no development of wrinkles or cracks was found in the cured film obtained after the exposure, development and calcination. The average step height of the wires was 500 nm and the thickness of the produced planarization film was 2000 nm.

Next, a top emission type organic EL element was formed on the resulting planarization film. First, a bottom electrode of ITO was formed on the planarization film by sputtering in connection with a wire via a contact hole. Then, a resist was coated, prebaked, and exposed through a mask of a desired pattern, thereby being developed. Pattern processing was carried out by wet etching using an ITO etchant and using the resist pattern as a mask. Then, the resist pattern was stripped using a resist stripping liquid (a mixed liquid of monoethanolamine and DMSO). The thus obtained bottom electrode corresponds to an anode of an organic EL element.

Next, a dielectric layer shaped so that it might cover the bottom electrode was formed. For the dielectric layer was used similarly the varnish of the photosensitive polyimide precursor composition obtained in Example 5. By providing this dielectric layer it is possible to prevent short-circuit between the bottom electrode and an upper electrode to be formed in a subsequent step. The dielectric layer was patterned and was subjected to heating treatment at 250° C. for 60 minutes, so that a dielectric layer having a moderate absorption near a wavelength of 450 nm was formed.

Moreover, a hole transporting layer, red, green, and blue organic light-emitting layers, and an electron transporting layer were provided one after another by vapor deposition via a desired pattern mask in a vacuum deposition apparatus. Subsequently, an upper electrode of aluminum was formed over the whole top surface of the substrate. This corresponds to a cathode of an organic EL element. The aforementioned substrate obtained was taken out of the vacuum deposition apparatus and then was sealed by bonding it to a sealing glass substrate using an ultraviolet-curable epoxy resin.

In the above-described manner, an active-matrix type organic EL display device in which a TFT has been connected to each organic EL element for driving it was obtained. Good luminescence was exhibited when voltage was applied via a driving circuit.

Example 13

A bottom gate type TFT was formed on a glass substrate and wiring (1.0 μm in height) connected to the TFT was formed. A dielectric film made of $Si_3N_4$ was formed so that the TFT and the wires might be covered therewith. Next, a contact hole was formed in this dielectric film. This wiring is an item for connecting a TFT and another TFT or an organic EL element to be formed in a subsequent step and a TFT.

Next, a bottom electrode of ITO was formed by sputtering in connection with a wire via a contact hole. Then, a resist was coated, prebaked, and exposed through a mask of a desired pattern, thereby being developed. Pattern processing was carried out by wet etching using an ITO etchant and using the resist pattern as a mask. Then, the resist pattern was stripped using a resist stripping liquid (a mixed liquid of monoethanolamine and DMSO). The thus obtained bottom electrode corresponds to an anode of an organic EL element.

Next, a dielectric layer having such a shape that it could cover the periphery of the bottom electrode, the TFT, and the steps of the wires was formed. As to the dielectric layer, the varnish of the photosensitive polyimide precursor composition obtained in Example 5 was spin coated onto the substrate, subsequently dried under reduced pressure, then prebaked on a hot plate at 120° C. for 3 minutes, then exposed and developed, and then subjected to heat calcination at 250° C. for 60 minutes under nitrogen flow. The coating property at the time of spin coating the varnish was good and no development of wrinkles or cracks was found in the cured film obtained after the exposure, development and calcination. The average step height of the wires was 500 nm and the thickness of the produced dielectric layer was 2000 nm. By providing this dielectric layer it is possible to prevent short-circuit between the bottom electrode and an upper electrode to be formed in a subsequent step. Thus, an dielectric layer having a moderate absorption near a wavelength of 450 nm was formed.

Moreover, a hole transporting layer, red, green, and blue organic light-emitting layers, and an electron transporting layer were provided one after another by vapor deposition via a desired pattern mask in a vacuum deposition apparatus. Subsequently, an upper electrode of aluminum was formed over the whole top surface of the substrate. This corresponds to a cathode of an organic EL element. The aforementioned substrate obtained was taken out of the vacuum deposition apparatus and then was sealed by bonding it to a sealing glass substrate using an ultraviolet-curable epoxy resin.

In the above-described manner, an active-matrix type organic EL display device in which a TFT has been connected to each organic EL element for driving it was obtained. Good luminescence was exhibited when voltage was applied via a driving circuit.

INDUSTRIAL APPLICABILITY

The resin composition of the present invention can be used suitably for applications such as a surface protective film and an interlayer dielectric film of a semiconductor element, a dielectric layer of an organic EL element, a planarization film of a TFT substrate for driving of a display device using an organic EL element, a wire-protecting dielectric film of a circuit board, an on-chip microlens of a solid imaging element, a planarization film for displays and solid imaging elements, a solder resist for circuit boards, an underfill agent, and a capping agent for preventing copper migration.

EXPLANATION OF REFERENCE NUMERALS

1: TFT
2: Wire
3: Dielectric film
4: Planarization film
5: ITO
6: Substrate
7: Contact hole
8: Dielectric layer

The invention claimed is:

1. A positive type resin composition comprising
   (a) a polyimide, a polybenzoxazole, or a resin that has an amide bond in its main chain and can form said polyimide or polybenzoxazole by dehydration-cyclization effected by heat treatment or by chemical treatment,
   (b) 1,5-dihydroxynaphthalene, 1,6-dihydroxynaphthalene, 1,7-dihydroxynaphthalene, or 2,3-dihydroxynaphthalene,
   (c) a thermal cross-linking agent having a structure represented by the following formula (1) or a thermal cross-linking agent having a group represented by the following formula (2):

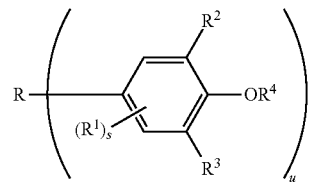
(1)

wherein in formula (1), R represents a linking group having 2 to 4 valencies, $R^1$ represents a monovalent organic group having 1 to 20 carbon atoms, Cl, Br, I, or F, $R^2$ and $R^3$ each represents $CH_2OR^5$ ($R^5$ is a hydrogen atom or a monovalent hydrocarbon group having 1 to 6 carbon atoms), $R^4$ represents a hydrogen atom, a methyl group or an ethyl group, s represents an integer of 0 to 2 and u represents an integer of 2 to 4;

$$—N(CH_2OR^6)_t(H)_v,\qquad(2)$$

wherein in formula (2), $R^6$ represents a hydrogen atom or a monovalent hydrocarbon group having 1 to 6 carbon atoms, t is 1 or 2 and v is 0 or 1, provided that t+v is 1 or 2, and
   (d) a photo acid generator.

2. A display device comprising a substrate in which a thin film transistor has been formed, a planarization film and/or a dielectric layer, and a display element in this order, wherein said planarization film and dielectric layer are obtained by curing the positive type resin composition according to claim 1.

3. The display device according to claim 2, wherein the display element is an organic electroluminescent element.

4. The positive type resin composition according to claim 1, wherein the change in transmission of light having a wavelength of 450 nm for a prebaked film and a cured film each having a thickness of 3.0 μm of said positive type resin composition is 20% or more.

* * * * *